United States Patent [19]
Yamazaki et al.

[11] Patent Number: 6,133,075
[45] Date of Patent: Oct. 17, 2000

[54] SEMICONDUCTOR DEVICE AND METHOD OF FABRICATING THE SAME

[75] Inventors: Shunpei Yamazaki, Tokyo; Hideto Ohnuma, Kanagawa; Tamae Takano, Kanagawa; Hisashi Ohtani, Kanagawa, all of Japan

[73] Assignee: Semiconductor Energy Laboratory Co., Ltd., Kanagawa-ken, Japan

[21] Appl. No.: 09/065,692

[22] Filed: Apr. 24, 1998

[30]  Foreign Application Priority Data

Apr. 25, 1997 [JP] Japan .................................. 9-123283
Apr. 25, 1997 [JP] Japan .................................. 9-123284

[51] Int. Cl.$^7$ .................................................. H01L 21/00
[52] U.S. Cl. .......................... 438/158; 438/160; 438/166; 438/172
[58] Field of Search .................................. 438/158, 160, 438/166, 172

[56]  References Cited

U.S. PATENT DOCUMENTS 5,605,847  2/1997  Zhang ........................................ 437/24
5,886,364  3/1999  Zhang ........................................ 257/53

*Primary Examiner*—Richard Elms
*Assistant Examiner*—Michael S. Lebentritt
*Attorney, Agent, or Firm*—Eric J. Robinson; Nixon Peabody LLP

[57]  ABSTRACT

There are disclosed techniques for providing a simplified process sequence for fabricating a semiconductor device. The sequence starts with forming an amorphous film containing silicon. Then, an insulating film having openings is formed on the amorphous film. A catalytic element is introduced through the openings to effect crystallization. Thereafter, a window is formed in the insulating film, and P ions are implanted. This process step forms two kinds of regions simultaneously (i.e., gettering regions for gettering the catalytic element and regions that will become the lower electrode of each auxiliary capacitor later).

70 Claims, 18 Drawing Sheets

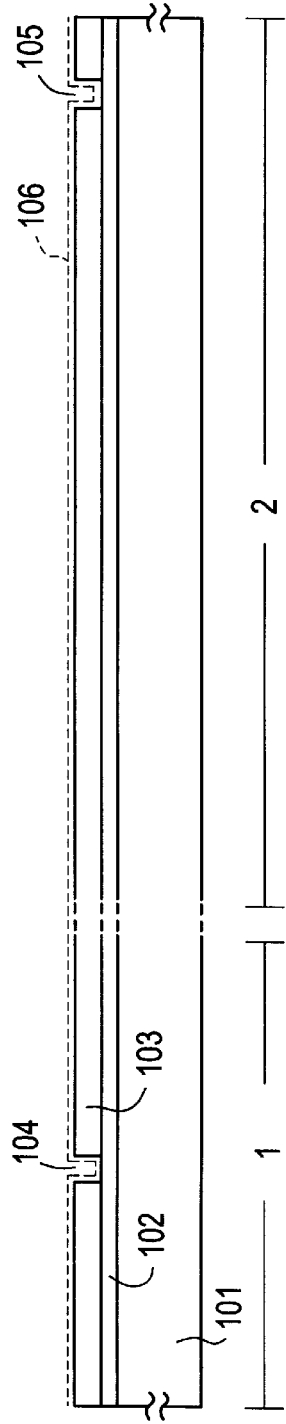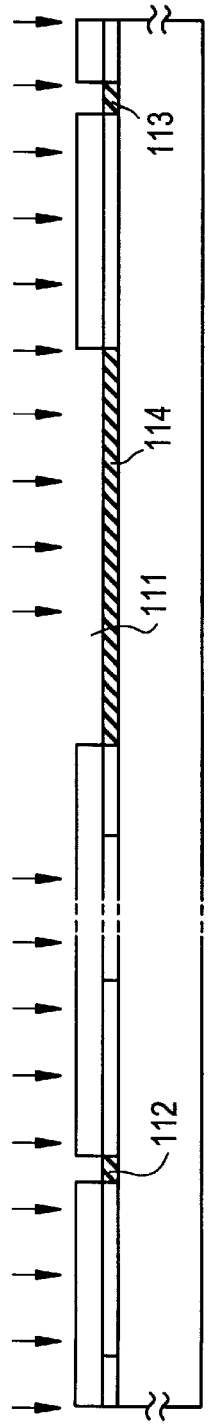

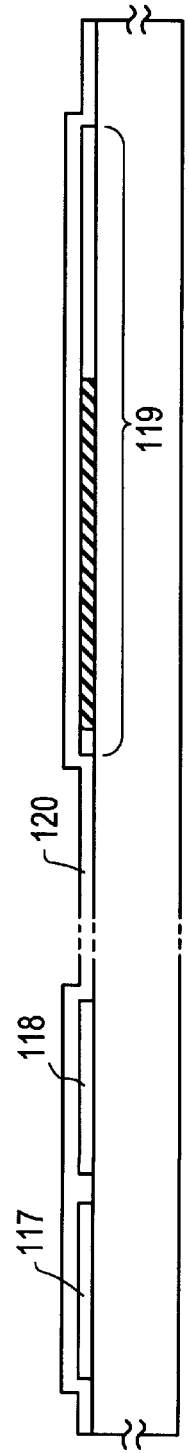

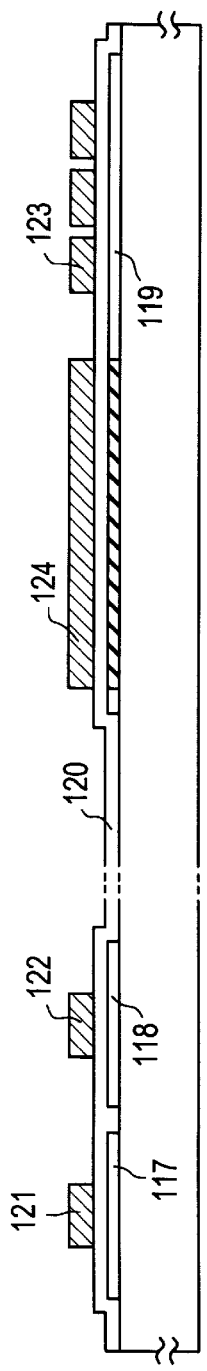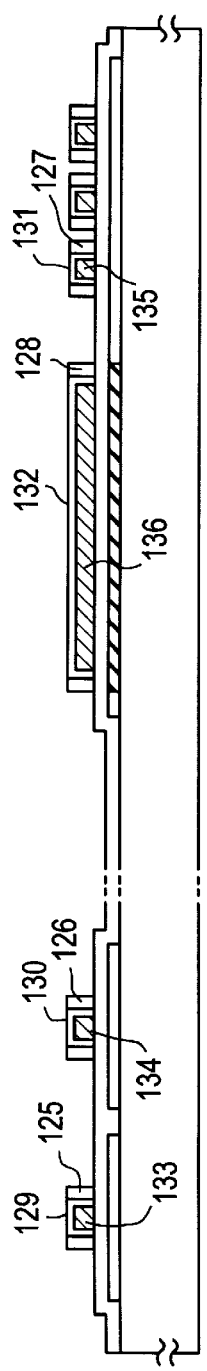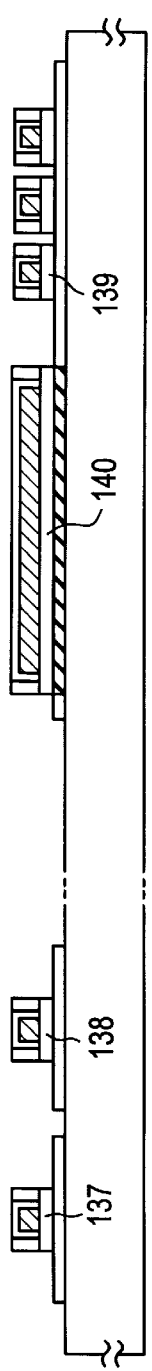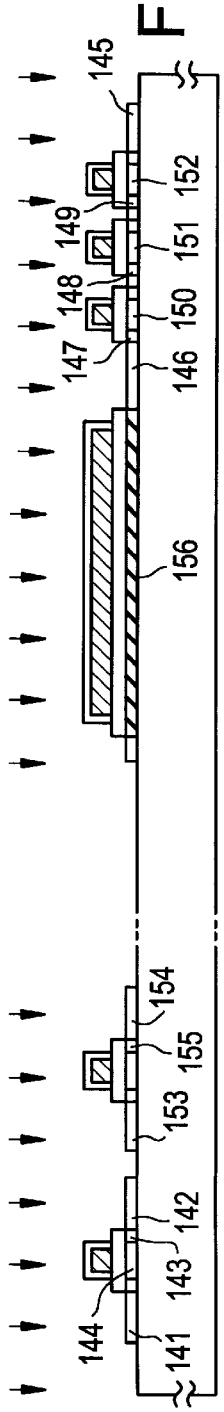

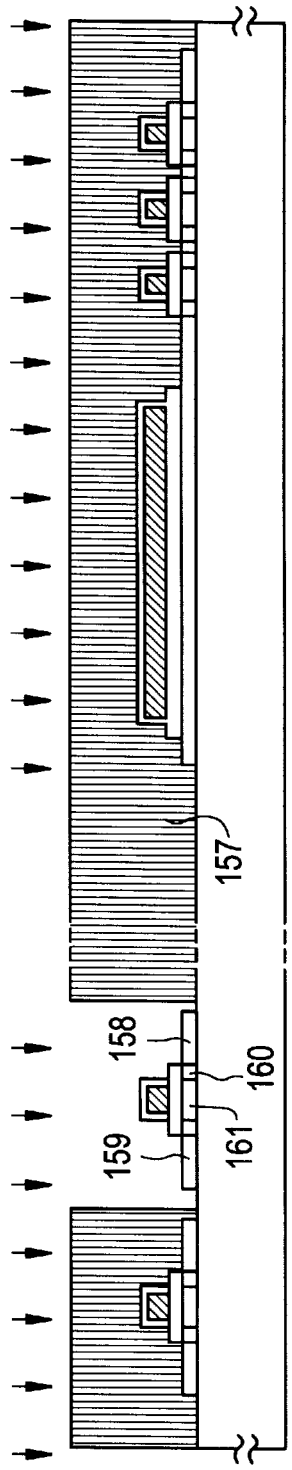
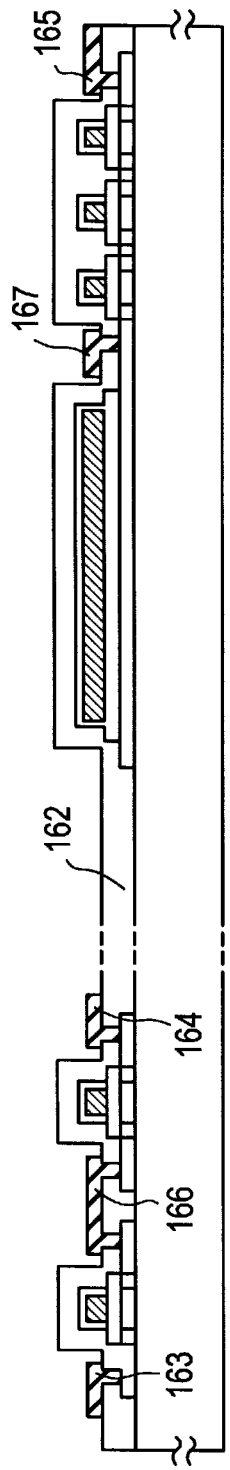
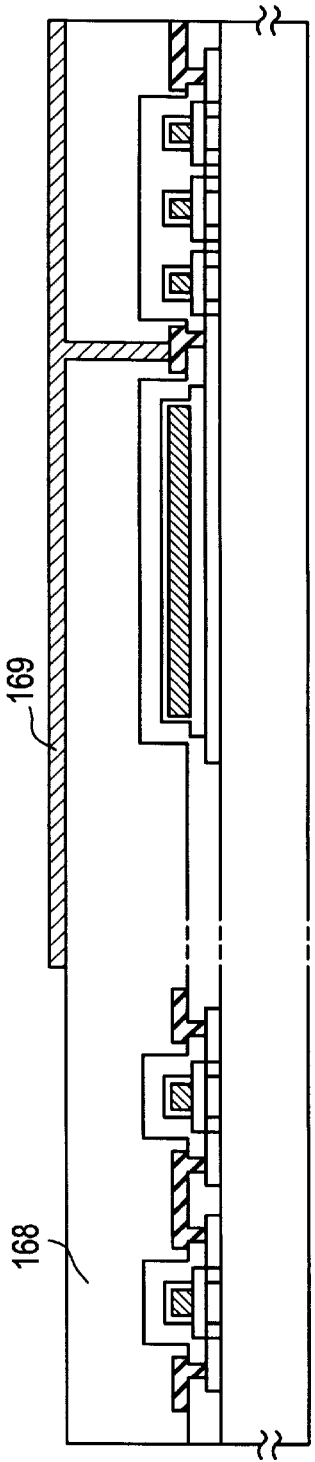

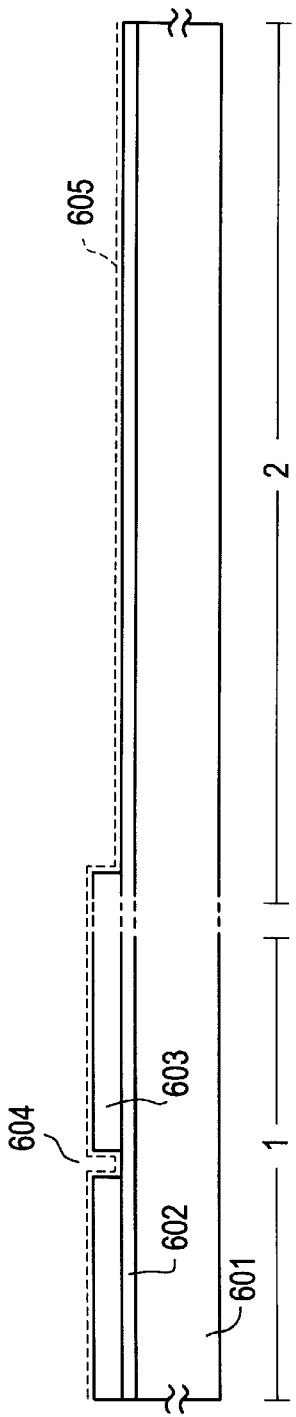
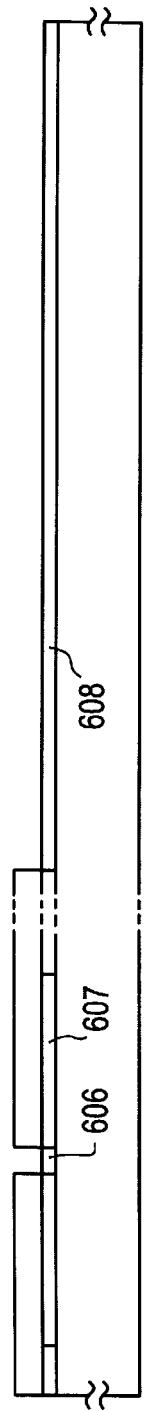
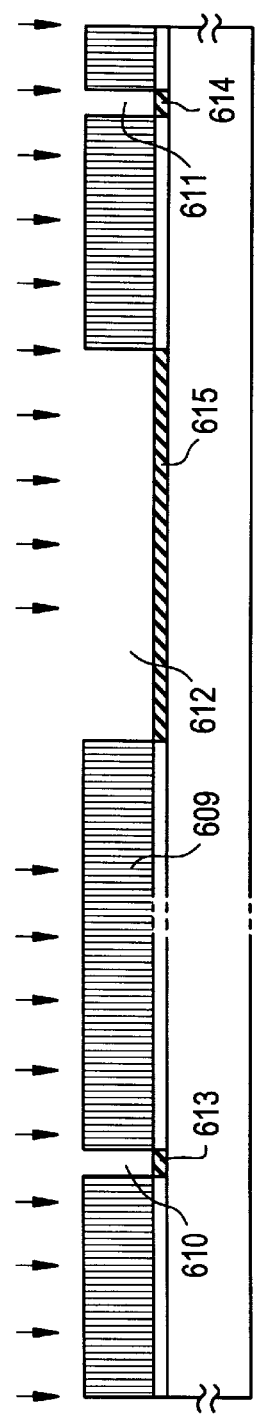

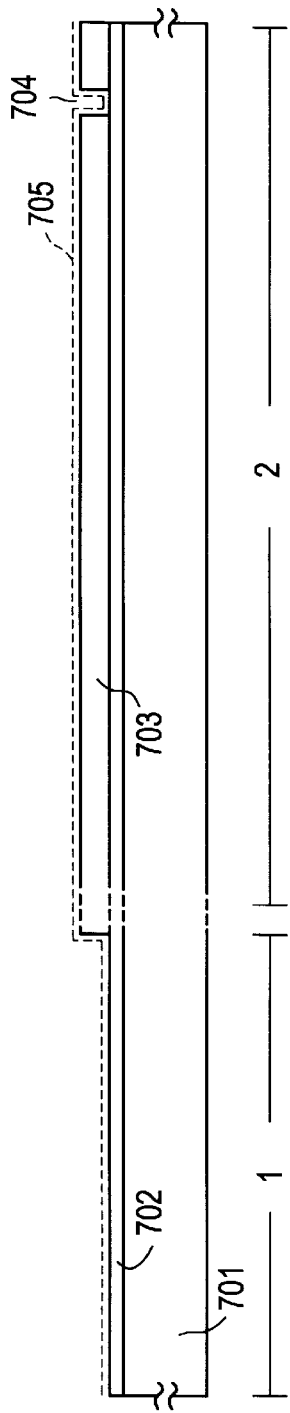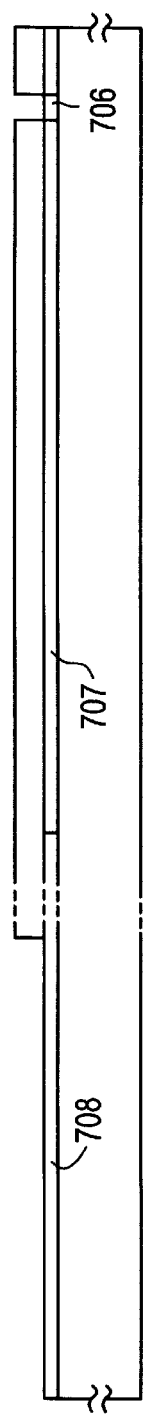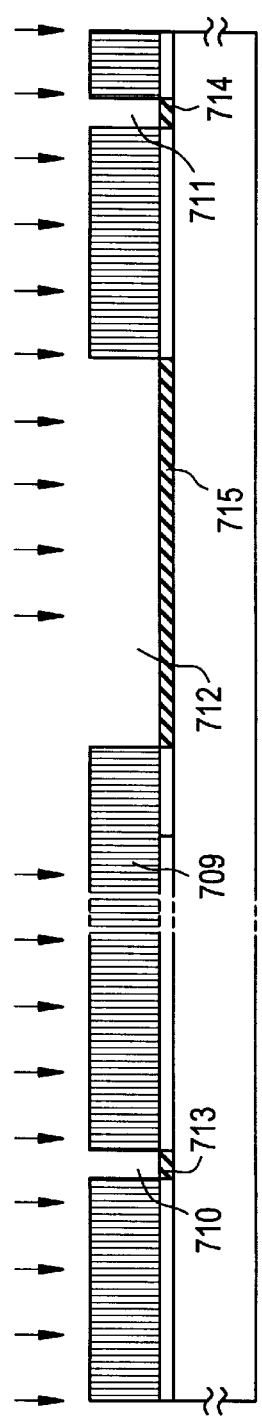

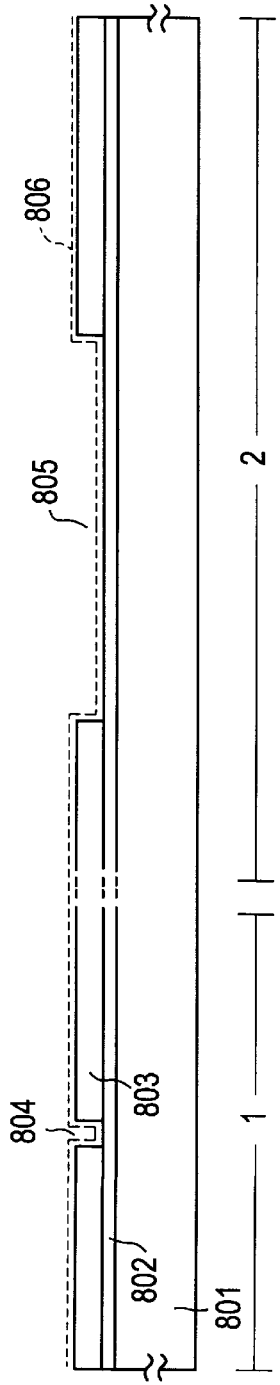
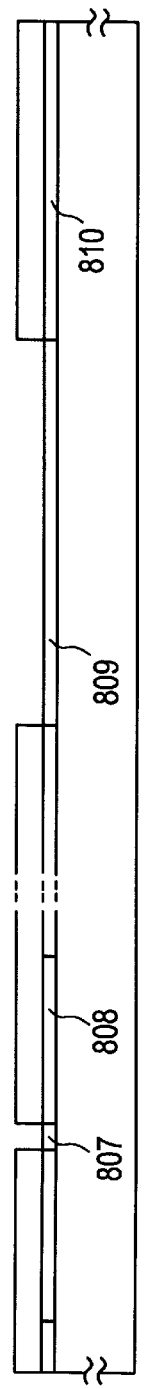
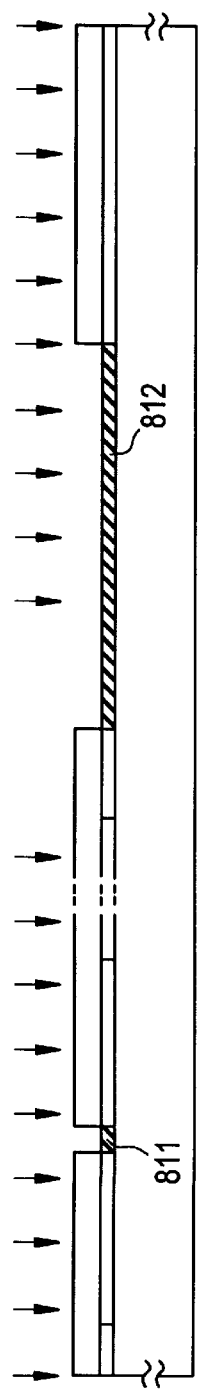

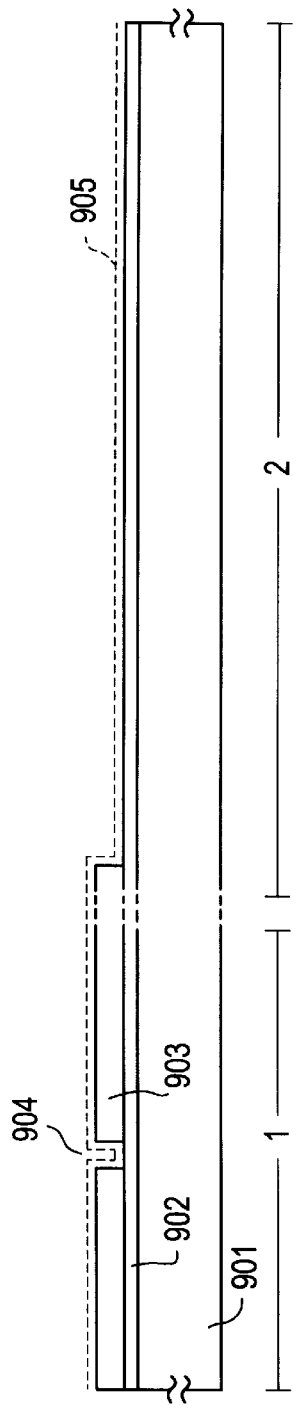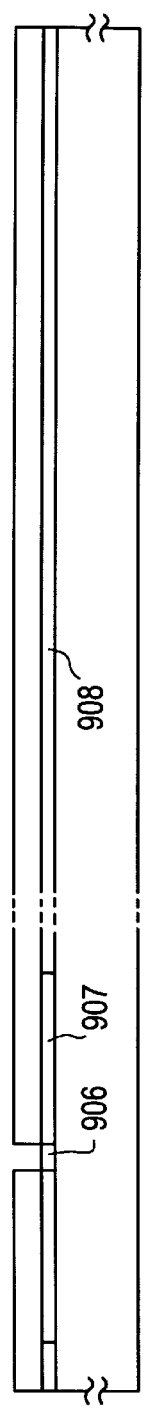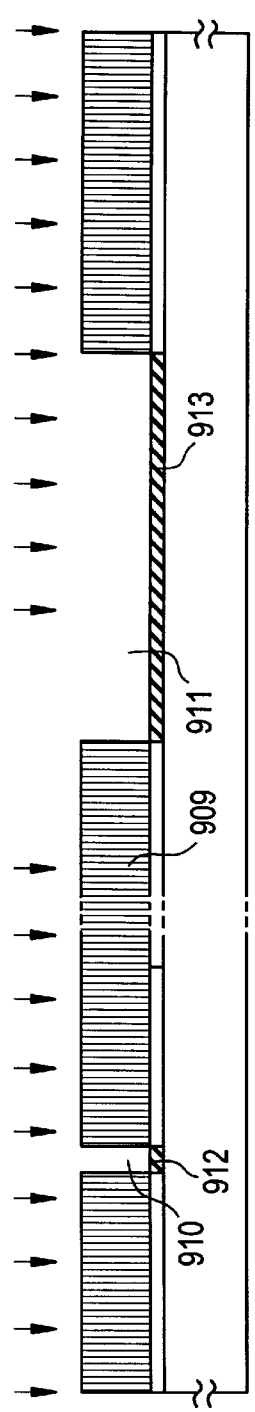

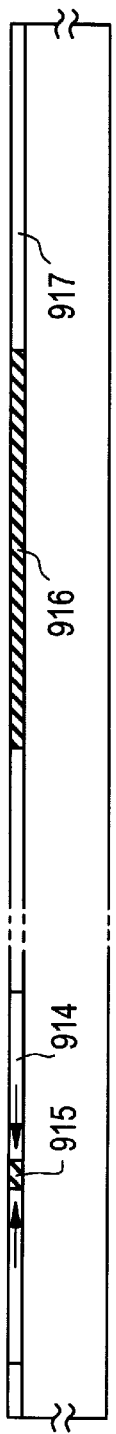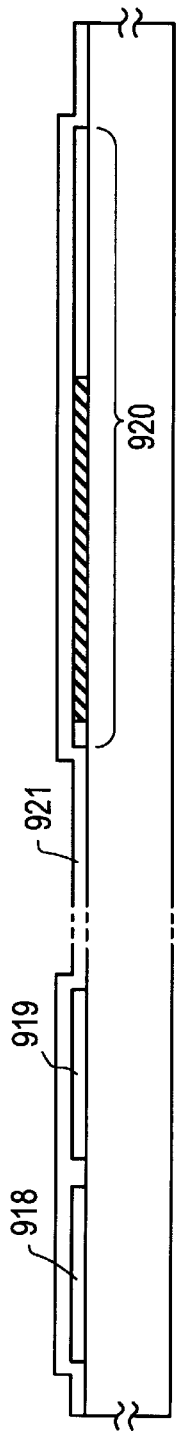

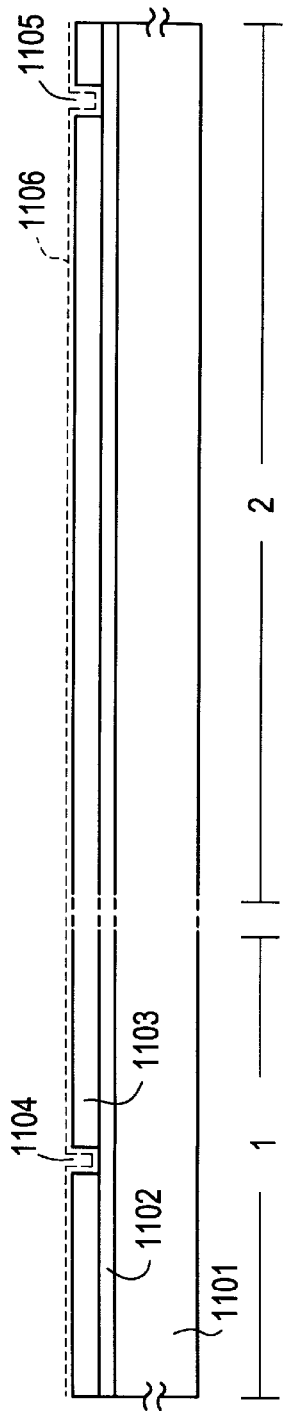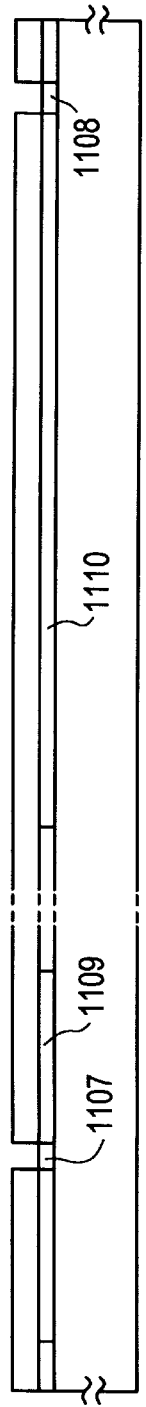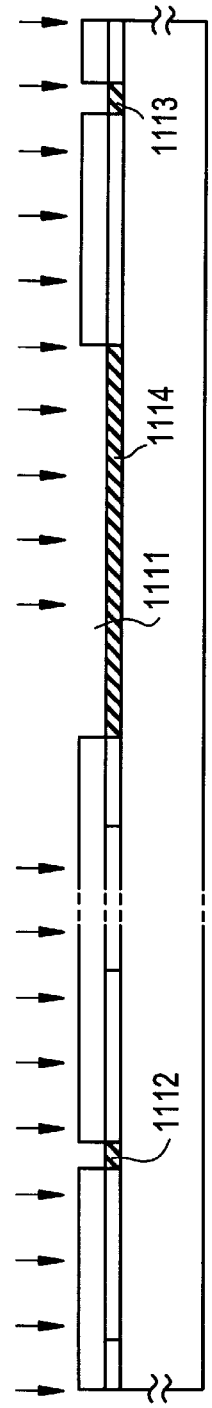

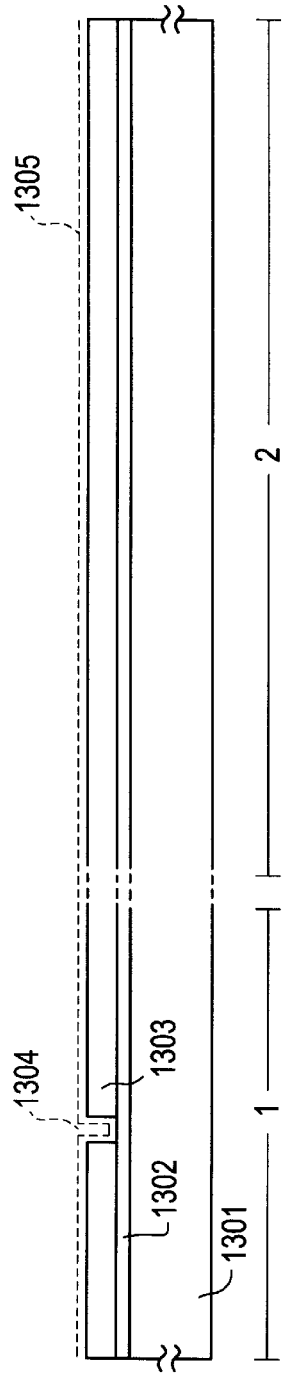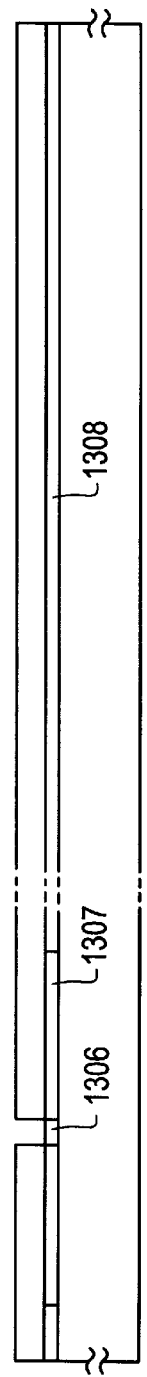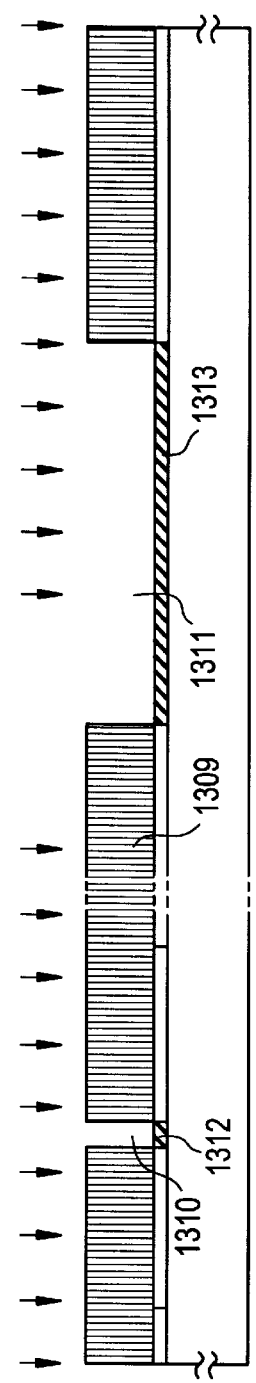

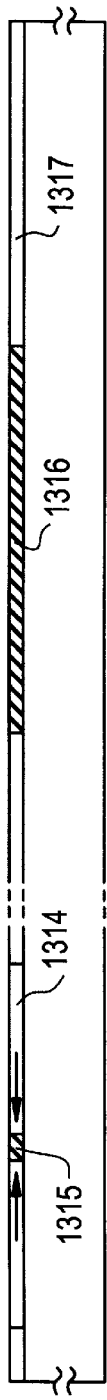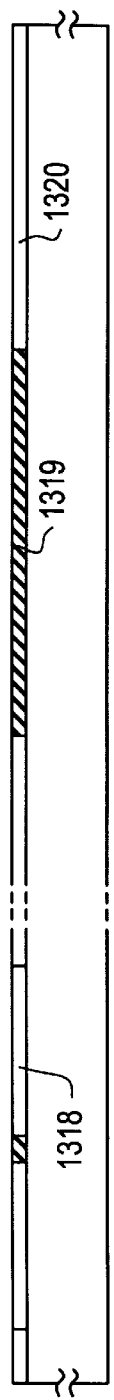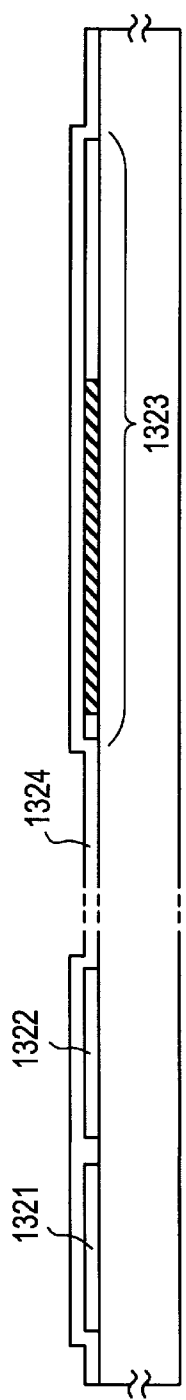

SEMICONDUCTOR DEVICE AND METHOD OF FABRICATING THE SAME

BACKGROUND OF THE INVENTION

1. Field of the Invention

The present invention relates to a semiconductor device utilizing a semiconductor thin film and to techniques for fabricating such a semiconductor device and, more particularly, to TFTs (thin-film transistors) utilizing a crystalline film containing silicon.

The semiconductor device referred to herein embraces every kind of device that functions by making use of a semiconductor. That is, the semiconductor device includes electrooptical devices (such as liquid crystal displays) and electronic devices on which such electrooptical devices are packed, as well as active components such as TFTs and MOSFETs (IGFETs). To make a clear distinction between two kinds of semiconductor devices, they will be referred to as the semiconductor device and as the display device, respectively.

2. Description of the Prior Art

In recent years, techniques for fabricating semiconductor circuits with TFTs (thin-film transistors) formed on substrates have evolved rapidly. Especially, an active matrix display using a crystalline silicon film (polysilicon film) as a thin-film semiconductor and having a common substrate on which both peripheral circuits and a pixel matrix circuit are packed have reached a practical level.

Among various kinds of active matrix displays, the active matrix liquid crystal display (AMLCD) is being actively developed as a display device adapted for use in a notebook computer, projector, or other mobile device. According to the mode of operation, AMLCDs are classified into two major groups: transmissive LCD and reflective LCD.

Presently, high information content, bright liquid crystal displays are being urgently developed. Structures have been developed in which each pixel is as small as less than 30 $\mu$m in square to meet the XGA standard (1024×768 pixels) or the SXGA standard (1280×1024 pixels).

In the aforementioned AMLCD, a voltage applied to the liquid crystal layer changes the optical response characteristic, thus turning on and off light. An auxiliary capacitor is usually added to each pixel to compensate for leakage of electric charge held on the liquid crystal layer.

We have already disclosed a method of obtaining a crystalline silicon film by making use of a catalytic element (typified by nickel) for promoting crystallization, to form a crystalline film containing silicon (see Japanese Unexamined Patent Publication No. 130652/1995). In particular, regions crystallized by direct introduction of a catalytic element (hereinafter referred to as the vertically grown regions) and crystallized regions (hereinafter referred to as the laterally grown regions) around the regions in which the catalytic element has been introduced are formed.

However, almost all catalytic elements are metal elements and so if the catalytic elements are left after the crystallization, the reliability of the finished TFTs will be impaired.

SUMMARY OF THE INVENTION

It is an object of the present invention to provide a simplified process sequence for fabricating a semiconductor device, the process sequence including a process step for effectively removing or reducing the catalytic element.

A method of fabricating a semiconductor device in accordance with the present invention starts with maintaining a catalytic element in contact with the whole surface or parts of an amorphous silicon film containing silicon. Otherwise, the catalytic element is introduced in the amorphous silicon film. The catalytic element promotes crystallization of the silicon. Then, the amorphous silicon film is heat-treated to crystallize those portions of the amorphous silicon film that should become active components. A chemical element selected from group VB (group 15) of the periodic table is introduced into regions adjacent to the portions becoming the active components and also into regions becoming the lower electrodes of auxiliary capacitors. Finally, a heat treatment is made to getter the catalytic element into the regions doped with the group VB (group 15) element.

Another method of fabricating a semiconductor device in accordance with the present invention starts with maintaining a catalytic element with the whole surface or parts of an amorphous silicon film containing silicon. Otherwise, the catalytic element is introduced into the amorphous silicon film. The catalytic element promotes crystallization of the silicon. Then, the amorphous silicon film is heat-treated to crystallize those portions of the amorphous silicon film that should become active components. A chemical element selected from group VB (group 15) of the periodic table is introduced into regions adjacent to the portions becoming the active components and also into regions becoming the lower electrodes of auxiliary capacitors. The regions containing group VB (group 15) element is heat-treated to getter the catalytic element into the regions doped with group VB (group 15) element. Finally, a heat treatment is performed in an ambient containing a halogen element to getter the catalytic element into the ambient.

A main object of the invention is to provide a simplified process sequence for gettering a catalytic element out of a crystalline film after an amorphous film containing silicon is crystallized using the catalytic element.

A method of gettering the catalytic element is now described briefly. One feature of the invention is to use the gettering effect of an element selected from group VB (group 15) of the periodic table. Another feature of the invention is to employ the combination of the gettering effect of the group VB (group 15) element and the gettering effect of a halogen element.

The typical examples of the above-described catalytic element include nickel (Ni), cobalt (Co), iron (Fe), palladium (Pd), platinum (Pt), copper (Cu), and gold (Au). Our experiment has shown that nickel is the optimum element.

Examples of the group VB (group 15) element that getters the catalytic element include nitrogen (N), phosphorus (P), arsenic (As), antimony (Sb), and bismuth (Bi). The element that exhibits the most conspicuous effect is phosphorus (P).

As a typical example, nickel is used as the catalytic element, and phosphorus is used as the gettering element belonging to group VB (group 15). A heat treatment around 600° C. results in the phosphorus and nickel being stably bonded. At this time, they can assume bonded states $Ni_3P$, $Ni_5P_2$, $Ni_2P$, $Ni_3P_2$, $Ni_2P_3$, $NiP_2$, and $NiP_3$.

Examples of the halogen element that getters the catalytic element described above include fluorine (F), chlorine (Cl), and bromine (Br). Especially, where nickel is used as the catalytic element, chlorine is liberated as volatile nickel chloride into a gas phase.

Where nickel is used as the catalytic element that accelerates the crystallization of the amorphous film containing silicon as described above, the catalytic element in the crystalline film can be removed or reduced by the gettering effect of the group VB (group 15) element.

Furthermore, the catalytic element can be removed or reduced by the gettering effect either of a group VB (group 15) element or of a halogen element. Where both gettering effects are used, greater advantages can be obtained.

Other objects and features of the invention will appear in the course of the description thereof, which follows.

BRIEF DESCRIPTION OF THE DRAWINGS

FIGS. 1A–1C are cross-sectional views of a semiconductor device, illustrating a process sequence for fabricating the device in accordance with the present invention;

FIGS. 2A–2B are cross-sectional views of a semiconductor device, illustrating another process sequence for fabricating the device in accordance with the present invention;

FIGS. 3A–3D are cross-sectional views of a semiconductor device, illustrating a further process sequence for fabricating the device in accordance with the present invention;

FIGS. 4A–4C are cross-sectional views of a semiconductor device, illustrating a still other process sequence for fabricating the device in accordance with the present invention;

FIGS. 6A–6C are cross-sectional views of a semiconductor device, illustrating an additional process sequence for fabricating the device in accordance with the present invention;

FIGS. 7A–7C are cross-sectional views of a semiconductor device, illustrating a yet further process sequence for fabricating the device in accordance with the present invention;

FIGS. 8A–8C are cross-sectional views of a semiconductor device, illustrating a still further process sequence for fabricating the device in accordance with the present invention;

FIGS. 9A–9C are cross-sectional views of a semiconductor device, illustrating a yet additional process sequence for fabricating the device in accordance with the present invention;

FIGS. 10A–10B are cross-sectional views of a semiconductor device, illustrating another process sequence for fabricating the device in accordance with the present invention;

FIGS. 11A–11C are cross-sectional views of a semiconductor device, illustrating another process sequence for fabricating the device in accordance with the present invention;

FIGS. 13A–13C are cross-sectional views of a semiconductor device, illustrating another process sequence for fabricating the device in accordance with the present invention;

FIGS. 14A–14C are cross-sectional views of a semiconductor device, illustrating another process sequence for fabricating the device in accordance with the present invention;

DETAILED DESCRIPTION OF THE INVENTION

Figure 5A:
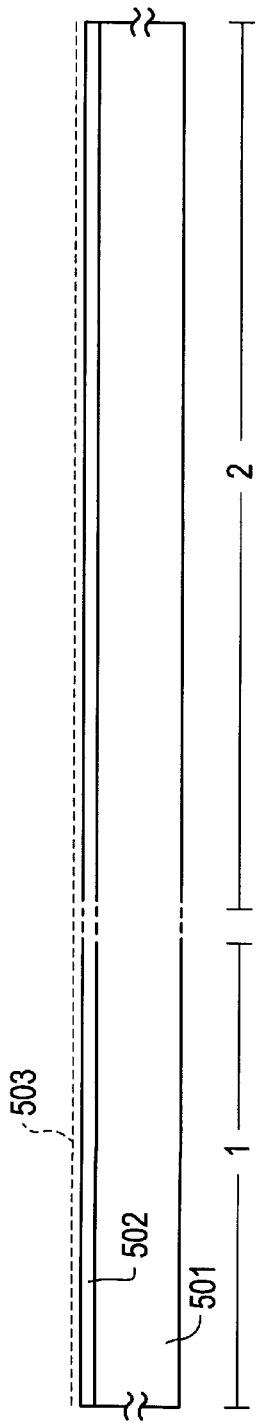
FIGS. 5A–5C are cross-sectional views of a semiconductor device, illustrating a yet other process sequence for fabricating the device in accordance with the present invention.

A method of fabricating a reflective liquid crystal display in accordance with the present invention is now described by referring to FIG. 1. In this first embodiment of the invention, a CMOS circuit and a pixel matrix circuit 2 are fabricated on the same substrate. The CMOS circuit is a fundamental circuit forming a peripheral circuit 1.

Note that the peripheral circuit 1 and the pixel matrix circuit 2 are not drawn to scale, for the sake of preparation of the figure. Rather, the pixel matrix circuit 2 is drawn in exaggerated size.

The peripheral circuit contains driver circuits typified by shift registers. Furthermore, the peripheral circuit contains logic circuits performing other signal processing. For instance, memories, D/A converters, operational amplifiers, pulse generators, and so on are contained in the logic circuit.

First, a glass substrate is prepared as a substrate 101 having an insulating surface. A silicon oxide film or the like is deposited as a buffer film on the substrate 101. Instead of the glass substrate, a silicon substrate or a ceramic substrate may be used.

Then, an amorphous silicon film 102 is formed to a thickness of 10 to 75 nm (preferably 15 to 45 nm) by plasma-enhanced CVD or LPCVD. Besides the amorphous silicon film, an amorphous semiconductor film containing silicon such as $Si_xGe_{1-x}$ (0<X<1) may be employed.

Thereafter, the amorphous silicon film 102 is crystallized, using the technique disclosed in Japanese Unexamined Patent Publication No. 78329/1996. This technique is characterized in that a catalytic element is selectively introduced into an amorphous silicon film to obtain crystalline regions (laterally grown regions) grown substantially parallel to the substrate.

Specifically, a mask insulator film 103 consisting of a silicon oxide film is formed to a thickness of 50 to 150 nm on the amorphous silicon film 102. Then, the mask insulator film 103 is patterned to form first openings 104 and 105 in regions in which nickel will be introduced.

These first openings 104 and 105 are so created that the vicinities of regions becoming active components (TFTs in the present embodiment) will be exposed later. That is, the laterally grown regions are just formed in the regions becoming the active components.

Subsequently, a thin oxide film (not shown) is formed on the exposed surface of the amorphous silicon film. This process step may be UV-light irradiation in an oxygen ambient. This oxide film will improve the wetting characteristics during the next solution application step.

Thereafter, a solution (e.g., a solution of nickel acetate or nickel nitrate) containing 100 ppm by weight of a catalytic element (nickel in the present specification) that promotes crystallization of silicon is applied to the amorphous silicon film 102 and to the mask insulator film 103. A nickel-containing layer 106 is formed by spin coating (FIG. 1A).

Where this technique disclosed in the above-cited Patent Publication is used, approximately $2 \times 10^{14}$ atoms/cm² of nickel is held on the surfaces of those portions of the amorphous silicon film which are exposed through the first openings 104 and 105.

Under this condition, a heat treatment is performed for crystallization. This treatment is effected at a temperature of 500 to 700° C. (typically 550 to 650° C.) for 4 to 24 hours (typically 8 to 15 hours). This processing diffuses nickel into the film, forming regions of crystallized silicon film 107–110 (FIG. 1B).

The regions 107 and 108 are very heavily doped with nickel. The regions 109 and 110 are laterally grown regions in which crystallization has progressed laterally. The regions 109 and 110 contain about $5 \times 10^{18}$ to $1 \times 10^{19}$ atoms/cm$^3$ of nickel. The regions not crystallized are left amorphous.

These laterally grown regions take a crystalline structure in which needle-like or columnar crystals are arrayed regularly in a certain direction. The needle-like crystals are grown substantially parallel to each other. Macroscopically, they are grown in the same direction.

The mask insulator film 103 is again patterned to form a second opening 111, for forming an electrode portion that will become the lower electrode of an auxiliary capacitor later. It is also possible to form a resist mask having openings after removing the mask insulator film 103 completely.

Then, phosphorus (P) ions are introduced by ion implantation or plasma doping. Instead of the P ions, arsenic (As) ions may be advantageously used (FIG. 1C).

In the ion implantation step according to the present embodiment, the accelerating voltage is 5 to 25 kV, and the dose is $1 \times 10^{13}$ to $8 \times 10^{15}$ atoms/cm$^2$ (preferably $5 \times 10^{13}$ to $1 \times 10^{15}$ atoms/cm$^2$). Because of these settings, the exposed portions of the amorphous silicon film are implanted with P ions at a dopant concentration of $5 \times 10^{19}$ to $2 \times 10^{21}$ ions/cm$^3$.

The present embodiment is characterized in that the first openings 104 and 105 permitting introduction of nickel enable introduction of phosphorus. Phosphorus-doped regions 112 and 113 under the first openings 104 and 105 act also as gettering regions for collecting nickel.

A phosphorus-doped region 114 formed under the second opening 111 becomes the lower electrode of the auxiliary capacitor having N-type conductivity. At the same time, the P-doped region 114 serves as a gettering region for collecting nickel.

In this way, the process step for introducing P ions in order to form gettering regions acts also as a process step for forming the lower electrode of the auxiliary capacitor. This constitutes one of the most important features of the present invention.

After the implantation step, the mask insulator film 103 is removed, followed by thermal processing conducted at 400 to 700° C. (typically 550 to 600° C.) in a nitrogen ambient for 2 to 24 hours (typically 8 to 12 hours). This moves nickel from the laterally grown regions 109 and 110 toward P-doped regions 112–114 (FIG. 2A).

This process step may be carried out before the removal of the mask insulator film 103. It is also advantageous to disperse the phosphorus through the silicon film by performing laser annealing prior to the thermal processing. Where this laser annealing is effected, it is advantageous to perform the laser annealing after the removal of the mask insulator film 103. The laser light can be emitted by an excimer laser using an exciting gas of KrF, ArF, XeCl, or the like, a CO$_2$ laser, or a YAG laser.

Thus, the nickel remaining in the laterally grown regions 109 and 110 is moved into the P-doped regions 112–114 by the gettering effect. This results in laterally grown regions 115 and 116 less doped with phosphorus. The gettering step using phosphorus element is disclosed by the present applicant in Japanese Unexamined Patent Publication No. 94607/1997 (FIG. 2A).

Although the P-doped regions 112–114 are made amorphous by the P-ion implantation step, this thermal processing recrystallizes these P-doped regions. We have confirmed by SIMS (secondary ion mass spectrometry) that the nickel concentration of the laterally grown regions 115 and 116 after the process step shown in FIG. 2A has decreased at least below $5 \times 10^{17}$ atoms/cm$^3$, i.e., lower than the detection limit.

At this time, nickel is gettered and collected into the phosphorus-doped regions 112–114 and so these regions are heavily doped with nickel. Analysis by SIMS has revealed that the nickel concentration is as high as $1 \times 10^{18}$ to $1 \times 10^{20}$ atoms/cm$^2$.

However, if nickel is left in the phosphorus-doped region 114 that will act as the lower electrode of the auxiliary capacitor later, no problems will take place provided it serves as the electrode. The phosphorus-doped regions 112 and 113 are not used at least in a channel region but can be used as source/drain regions. Essentially, the phosphorus-doped regions are removed when an active layer is formed. Hence, there arise no problems irrespective of whether the nickel is present or not.

After obtaining the state of FIG. 2A, the silicon film is patterned to form islands of active layer 117–119. The islands of active layer 117 and 118 mainly form N-type and P-type TFTs, respectively, of a CMOS circuit forming a peripheral circuit. The island of active layer 119 becomes a pixel TFT (N-type TFT in the present embodiment) forming a pixel matrix circuit.

Then, an oxide (not shown) formed on the silicon film surface is removed. Since contaminants in the silicon film are incorporated into the oxide on the surface, a clean silicon film surface can be obtained by removing the oxide.

Immediately thereafter, a silicon oxide film 120 becoming the gate insulator film is deposited to a thickness of 10 to 150 nm by plasma-enhanced CVD. Of course, low-pressure thermal CVD or sputtering may be used instead. Furthermore, ECR plasma CVD or high-density plasma CVD is used to advantage (FIG. 2B).

Then, islands of metallization layer 121–124 consisting only or chiefly of aluminum are formed. These islands of metallization layer 121–124 will form the gate electrode of a CMOS circuit or a pixel TFT. The island 124 will form the upper electrode of the auxiliary capacitor.

In the present embodiment, a triple-gate TFT is used as the pixel TFT and so the metallization layer 123 becoming electrodes are shown to be split into three. In practice, however, the metallization layer 123 is a continuously extending electrode.

After deriving the state of FIG. 3A, the two anodic oxidation steps are carried out. The following process steps between the anodization step and the ion implantation step depend on the techniques described by the present applicant in Japanese Unexamined Patent Publication No. 135318/1995. Therefore, for details of the conditions, see this Japanese Patent Publication.

After building up the islands of metallization layer 121–124, anodic oxidation is carried out within a 3% aqueous solution of tartaric acid to form porous islands of anodic oxide film 125–128. Subsequently, anodic oxidation is performed within an ethylene glycol solution containing a 3% tartaric acid, resulting in islands of non-porous anodic oxide film 129–132. After these two anodization steps, gate electrodes 133–135 and the upper electrode 136 of the auxiliary capacitor are defined.

Then, after deriving the state of FIG. 3B, using the gate electrode and the porous anodic oxide film as a mask, the gate insulator film 120 is etched by dry-etching techniques. This gives rise to islands of gate insulator film 137–140. The island of gate insulator film 140 acts as the insulating film of an auxiliary capacitor (FIG. 3C).

Then, as shown in FIG. 3D, the porous anodic oxide film, 125–128, is removed. A high-energy P ion implantation and a low-energy P ion implantation are performed. As a result, the source region 141 and the drain region 142 of an N-type TFT, a pair of lightly doped (LDD) regions 143, and a channel region 144 are formed.

In the present embodiment, in order to fabricate the pixel TFT from an N-type TFT, the source region 145 and the drain region 146 of a pixel TFT, a pair of lightly doped regions 147–149, and channel regions 150–152 are formed.

At this time, P ions are also introduced into the active layer of the P-type TFT. In consequence, regions 153 and 154 doped with P ions at the same concentration as the source/drain regions described above and a region 155 doped with P ions at the same concentration as the lightly doped regions are formed. No P ions are implanted into a region 156 at all; rather the P ion concentration is maintained. However, this region is substantially integrated with the pixel TFT and with the drain region 146.

Then, a resist mask 157 is placed to expose only the P-type TFT. A high-energy B ion implantation and a low-energy B ion implantation are carried out. This processing step converts all the P ion-doped regions 153–155 shown in FIG. 3D into the P-type, forming the source region 158 and the drain region 159 of a P-type TFT, a pair of lightly doped regions 160, and a channel region 161 (FIG. 4A).

Where the ion implantation steps described above are exploited, the source/drain regions of the N-type TFT and the P-type TFT can be fabricated with only one patterning step.

After the resist mask 157 has been removed, the implanted P and B ions are activated by furnace annealing, laser annealing, lamp annealing, or a combination thereof. At the same time, the crystallinity of the active layer deteriorated by the ion implantation is healed.

Then, a laminate film consisting of a silicon oxide layer and a silicon nitride layer is formed as a first interlayer dielectric film 162. Contact holes are created, and then source electrodes 163–165 and drain electrodes 166, 167 are formed (FIG. 4B).

An organic resinous film of polyimide, polyamide, polyimidamide, acrylic resin, or the like is formed as a second interlayer dielectric film 168 to a thickness of 0.5 to 3 $\mu$m (preferably 1.5 to 2.5 $\mu$m). The greatest feature of the organic resinous film is that it has a relative dielectric constant of about 2.0 to 3.4. Hence, the parasitic capacitance between adjacent conducting lines can be reduced greatly. That is, in a circuit that is required to be operated at high speeds such as a logic circuit, drops in operating speed can be effectively suppressed.

Thereafter, a contact hole is formed in the second interlayer dielectric film 168, and a pixel electrode 169 is formed. In the present embodiment, the pixel electrode 169 consists only or chiefly of aluminum.

Finally, the obtained TFT is totally heat-treated in a hydrogen ambient to perform hydrogen termination. Thus, the dangling bonds in the active layer are reduced. In this way, as shown in FIG. 4C, an active matrix display substrate on which both a CMOS circuit and pixel TFTs are packed is completed.

Then, a liquid crystal layer is sandwiched between the above-described active matrix display substrate and a counter substrate by a well-known cell assembly step, thus completing a reflective liquid crystal display.

The manufacturer may appropriately determine the fabricational parameters such as the kind of the liquid crystal material and the cell gap. In the present embodiment, a black mask is formed on the counter substrate. It may also be formed in required locations on the active matrix display substrate.

Another method of fabricating a reflective liquid crystal display in accordance with the invention is next described by referring to FIGS. 11A–11C. This method constitutes a second embodiment of the invention. In the present embodiment, a CMOS circuit and a pixel matrix circuit 2 are formed on the same substrate. The CMOS circuit is a fundamental circuit forming a peripheral circuit 1.

First, a quartz substrate 1101 is prepared as a substrate having an insulating surface. A buffer layer consisting of a silicon oxide film or the like may be deposited on the quartz substrate 1101. Instead of the quartz substrate, a silicon substrate or a ceramic substrate may be employed.

Then, an amorphous silicon film 1102 is formed to a thickness of 10 to 75 nm (preferably 15 to 45 nm) by plasma-enhanced CVD or LPCVD. It is also possible to use an amorphous semiconductor film containing silicon, such as $Si_xGe_{1-x}$ (0<X<1), instead of the amorphous silicon film.

Thereafter, the amorphous silicon film 1102 is crystallized, using the technique disclosed in Japanese Unexamined Patent Publication No. 78329/1996. This technique is characterized in that a catalytic element is selectively introduced into an amorphous silicon film to obtain crystalline regions (laterally grown regions) grown substantially parallel to the substrate.

Specifically, a mask insulator film 1103 consisting of a silicon oxide film is formed to a thickness of 50 to 150 nm on the amorphous silicon film 1102. Then, the mask insulator film 1103 is patterned to form first openings 1104 and 1105 in regions into which nickel will be introduced.

These first openings 1104 and 1105 are so created that the vicinities of regions becoming active components (TFTs in the present embodiment) will be exposed later. That is, the laterally grown regions are just formed in the regions becoming the active components.

Subsequently, a thin oxide film (not shown) is formed on the exposed surface of the amorphous silicon film. This process step may be UV-light irradiation in an oxygen ambient. This oxide film will improve the wetting characteristics during the next solution application step.

Thereafter, a solution (e.g., a solution of nickel acetate or nickel nitrate) containing 100 ppm by weight of a catalytic element (nickel in the present specification) that promotes crystallization of silicon is applied to the amorphous silicon film 1102 and to the mask insulator film 1103. A nickel-containing layer 1106 is formed by spin coating (FIG. 11A).

Where this technique disclosed in the above-cited Patent Publication is used, approximately $2\times10^{14}$ atoms/cm$^2$ of nickel is held on the surfaces of those portions of the amorphous silicon film which are exposed through the first openings 1104 and 1105 formed in the mask insulator film.

Under this condition, a heat treatment is performed for crystallization. This treatment is effected at a temperature of 500 to 700° C. (typically 550 to 650° C.) for 4 to 24 hours (typically 8 to 15 hours). This processing diffuses nickel into the film, forming regions of crystalline silicon film 1107–1110 (FIG. 11B).

The regions 1107 and 1108 are very heavily doped with nickel. The regions 1109 and 1110 are laterally grown regions in which crystallization has progressed laterally. The regions 1109 and 1110 contain about $5 \times 10^{18}$ to $1 \times 10^{19}$ nickel atoms/cm$^3$. The regions not crystallized are left amorphous.

These laterally grown regions take a crystalline structure in which needle-like or columnar crystals are arrayed regularly. The needle-like crystals are grown substantially parallel to each other. Macroscopically, they are grown in the same direction.

The mask insulator film 1103 is again patterned to form a second opening 1111, for forming an electrode portion that will become the lower electrode of an auxiliary capacitor later. It is also possible to form a resist mask having openings after removing the mask insulator film 1103 completely.

Then, phosphorus (P) ions are introduced by ion implantation or plasma doping. Instead of the P ions, arsenic (As) ions may be advantageously used (FIG. 11C).

In the ion implantation step according to the present embodiment, the accelerating voltage is 5 to 25 kV, and the dose is $1 \times 10^{13}$ to $8 \times 10^{15}$ atoms/cm$^2$ (preferably $5 \times 10^{13}$ to $1 \times 10^{15}$ atoms/cm$^2$). Because of these settings, the exposed portions of the amorphous silicon film are implanted with P ions at a dopant concentration of $5 \times 10^{19}$ to $2 \times 10^{21}$ atoms/cm$^3$.

The present embodiment is characterized in that the first openings 1104 and 1105 permitting introduction of nickel enable introduction of phosphorus. Phosphorus-doped regions 1112 and 1113 under the first openings 1104 and 1105 act also as gettering regions for collecting nickel.

A phosphorus-doped region 1114 formed under the second opening 1111 becomes the lower electrode of the auxiliary capacitor having N-type conductivity. At the same time, the P-doped region 1114 serves as a gettering region for collecting nickel.

In this way, the process step for introducing P ions to form gettering regions acts also as a process step for forming the lower electrode of the auxiliary capacitor. This constitutes one of the most important features of the present invention.

Figure 12A:
FIGS. 12A–12C are cross-sectional views of a semiconductor device, illustrating another process sequence for fabricating the device in accordance with the present invention.

After the implantation step, the mask insulator film 1103 is removed, followed by thermal processing conducted at 400 to 700° C. (typically 550 to 600° C.) in a nitrogen ambient for 2 to 24 hours (typically 8 to 12 hours). This moves nickel from the laterally grown regions 1109 and 1110 toward P-doped regions 1112–1114 (FIG. 12A).

This process step may be carried out before the removal of the mask insulator film 1103. It is also advantageous to disperse the phosphorus through the silicon film by performing laser annealing prior to the thermal processing. Where this laser annealing is effected, it is advantageous to perform the laser annealing after the removal of the mask insulator film 1103. The laser light can be emitted by an excimer laser using an exciting gas of KrF, ArF, XeCl, or the like, a CO$_2$ laser, or a YAG laser.

Thus, the nickel remaining in the laterally grown regions 1109 and 1110 is moved into the P-doped regions 1112–1114 by the gettering effect. This results in laterally grown regions 1115 and 1116 less doped with nickel. The gettering step using phosphorus element is disclosed by the present applicant in Japanese Unexamined Patent Publication No. 94607/1997 (FIG. 12A).

Although the P-doped regions 1112–1114 are made amorphous by the P-ion implantation step, this thermal processing recrystallizes these P-doped regions.

Figure 12B:
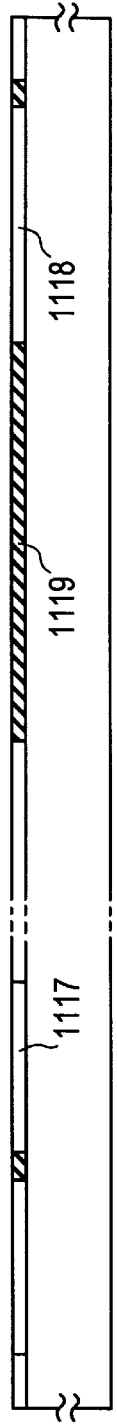

After obtaining the state of FIG. 12A, thermal processing is performed in an ambient containing a halogen element. In the present embodiment, the ambient consists of oxygen O$_2$ containing 0.5 to 10% (typically 3%) by volume of hydrogen chloride (HCl) (FIG. 12B).

Besides the HCl, one or more compounds selected from the group consisting of HF, NF$_3$, HBr, Cl$_2$, ClF$_3$, BCl$_3$, F$_2$, Br$_2$, and other components containing a halogen can be used. In addition, hydrogenated halogens can be used.

Preferably, this thermal processing is performed above 700° C. (typically 800 to 1000° C., 950° C. in the present embodiment) to carry out gettering of nickel, using chlorine, effectively. This processing exhaustively removes nickel from the whole crystalline silicon film or reduces the nickel concentration.

Prior to this thermal processing, the phosphorus-doped regions 1112–1114 have been crystallized. Therefore, the thermal diffusion of the P ions can be minimized though the thermal processing is effected at a high temperature.

We have confirmed by SIMS (secondary ion mass spectrometry) that the nickel concentration of the laterally grown regions 1117 and 1118 after the process step shown in FIG. 12B has decreased at least below $5 \times 10^{17}$ atoms/cm$^3$, i.e., lower than the detection limit.

At this time, nickel is gettered even from the phosphorus-doped regions 1112–1114. Although these are heavily doped with nickel, the concentration can be decreased below $5 \times 10^{17}$ atoms/cm$^3$ in the same way as the laterally grown regions, depending on the gettering processing conditions in an ambient containing a halogen element.

A large amount of nickel is gettered and collected into the phosphorus-doped region 1119 becoming the lower electrode of the auxiliary capacitor. Therefore, it is considered that even if gettering is effected using a halogen element, the lower electrode of the auxiliary capacitor for the finished TFT is more heavily doped with nickel than the channel region.

If nickel is left in the lower electrode of the auxiliary capacitor, no problems will take place provided it serves as the electrode. The phosphorus-doped regions 1112 and 1113 are not used at least in a channel region but can be used as source/drain regions. Essentially, the phosphorus-doped regions 1112 and 1113 are removed when an active layer is formed. Hence, the presence or absence of the nickel poses no problems.

Because of this thermal processing, the halogen element is incorporated into the laterally grown regions. Therefore, in the final active layers (laterally grown regions), the halogen element exists at a concentration of $1 \times 10^{15}$ to $1 \times 10^{20}$ atoms/cm$^3$.

Our analysis by TEM (transmission electron microscopy) has shown that these laterally grown regions 1117 and 1118 take a crystalline structure in which rodlike or flat rodlike crystals are arrayed regularly in a given direction.

This crystal structure is similar in features to the aforementioned laterally grown regions. However, our various analyses had led us to estimate that the boundaries between the rodlike microcrystallites (that may be referred to as needle-like crystals) consist of continuous lattices, show very good matching, and are electrically inactive, because the electrical characteristics of a TFT using an active layer consisting of a crystalline silicon film of such a crystal structure are better than those of a MOSFET fabricated on a single-crystal silicon. Details of this crystal structure are described by the present applicant in Japanese Patent Application No. 335152/1996, filed on Nov. 29, 1996.

After obtaining the state of FIG. 12B, the silicon film is patterned to form islands of active layer 1120–1222. The islands of active layer 1120 and 1121 mainly form N- and P-type TFTs, respectively, of a CMOS circuit forming a peripheral circuit. The island of active layer 1122 becomes a pixel TFT (N-type TFT in the present embodiment) forming a pixel matrix circuit.

Then, an oxide (not shown) formed on a surface of the silicon film is removed. Since contaminants in the silicon film are incorporated into the oxide on the surface, a clean silicon film surface can be obtained by removing the oxide.

Figure 12C:
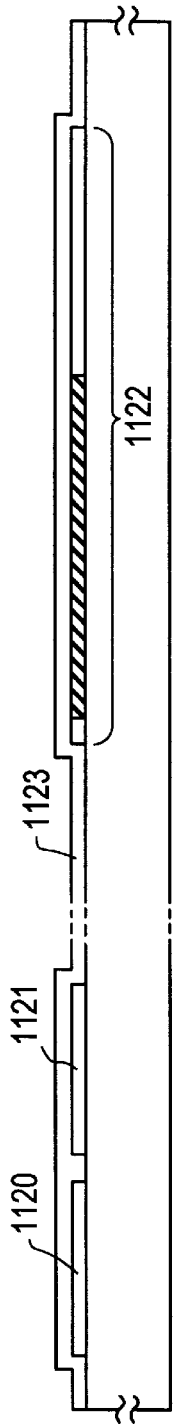

Immediately thereafter, a silicon oxide film 1123 becoming the gate insulator film is deposited to a thickness of 10 to 150 nm by plasma-enhanced CVD. A thermal treatment is made again above 700° C. Preferably, this processing is performed in an ambient containing a halogen element as described above. In this case, the conditions can be made the same as the above-described conditions (FIG. 12C).

The film quality of the gate insulator film 1123 can be effectively improved by performing a heat treatment in an inert ambient as the final step of this thermal processing.

It can be expected that this thermal processing will further remove the nickel remaining in the active layer. A thermal oxide film is formed at the interface between the active layer, 1120–1122, and the gate insulator film 1123. In consequence, a good active layer-gate insulator film interface having less interface levels can be obtained.

Then, the same process steps as the steps of the first embodiment illustrated in FIGS. 3 and 4 are carried out to complete the semiconductor device.

A third embodiment of the invention provides a method of forming a crystalline silicon film by means different from those used in the first and second embodiments. The process sequence of this third embodiment is similar to the process sequence of the first and second embodiments except for the steps illustrated in FIGS. 1A, 1B, 1C (the first embodiment) or the steps illustrated in FIGS. 11A, 11B, 11C (the second embodiment), i.e., the steps performed prior to the gettering step using phosphorus element. Therefore, only these different steps are next described.

In the present embodiment, the method of forming vertically grown regions as described in Japanese Unexamined Patent Publication No. 0130625/1995 is utilized as a means for crystallizing the amorphous silicon film.

In FIG. 5A, there are shown a substrate 501 and an amorphous silicon film 502. Where the second embodiment is used, the substrate 501 is a quartz substrate. Where a vertically grown region is formed, any mask insulator film as used in the first or second embodiment is not necessary. A nickel-containing layer 503 is formed over the whole surface of the amorphous silicon film 502.

The nickel concentration of the solution containing nickel is 10 ppm by weight. At the surface of the amorphous silicon film, the concentration is about $3\times10^{13}$ atoms/cm$^2$.

Figure 5B:

Under this condition, a heat treatment is made to crystallize the amorphous film. In the present embodiment, the heat treatment is performed at 600° C. for 4 hours. As a result, the whole amorphous silicon film 502 is crystallized. Thus, a crystalline silicon film 504 that is known as a vertically grown region is obtained (FIG. 5B).

Then, a resist mask 505 is formed. Openings 506–508 permitting introduction of P ions are formed in the resist mask 505. This is followed by implantation of P ions. Consequently, phosphorus-doped regions 509–511 are formed (FIG. 5C).

At this time, the regions 509 and 510 in which P ions are introduced from the openings 506, 507 act as gettering regions that collect nickel. If these gettering regions are spaced too remotely from the portions where active components should be fabricated, the gettering effect decreases. Therefore, the gettering regions are preferably adjacent to the portions where the active components should be fabricated.

The region 511 in which the P ions are introduced from the opening 508 acts as the lower electrode of the auxiliary capacitor. Of course, the region serves as a gettering region as well.

Figure 5C:
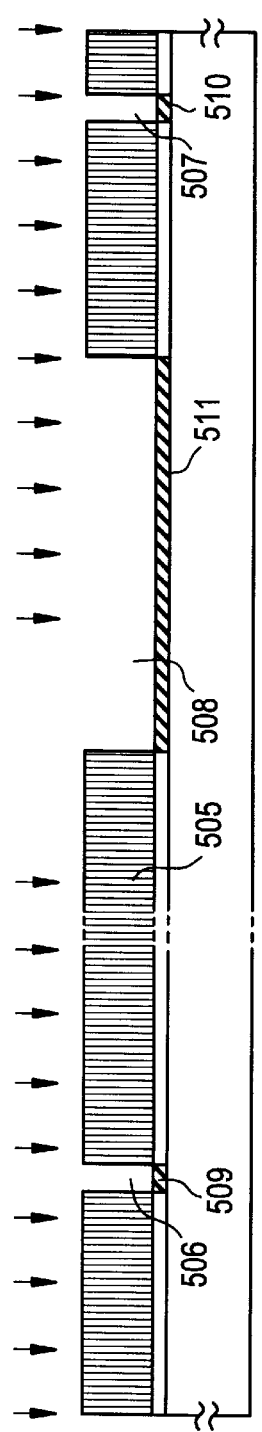

As a result, a state as shown in FIG. 5C is obtained. Then, the process sequence is carried out in the same way as in the first or second embodiment described above, thus completing a semiconductor device.

A fourth embodiment of the invention gives an example in which vertically grown regions and laterally grown regions are separately used on the same substrate in manufacturing a semiconductor device. The process sequence of this fourth embodiment is similar to the process sequences of the first, second, and third embodiments except up to the process step for performing gettering using phosphorus element. Therefore, only the characteristic step is described below.

Referring to FIG. 6A, there are shown a substrate 601 and an amorphous silicon film 602. Where the second embodiment described above is employed, the substrate 601 is a quartz substrate. In the present embodiment, a peripheral circuit is composed of laterally grown regions. A pixel matrix circuit is composed of vertically grown regions. Therefore, a mask insulator film 603 is not formed in regions 2 becoming the pixel matrix circuit. Openings 604 are formed at required locations in regions 1 becoming the peripheral circuit.

A solution containing nickel is applied and a nickel-containing layer 605 is formed by spin coating. At this time, the nickel concentration of the solution is set to 100 ppm by weight in the same way as in the first and second embodiments described above. If the concentration is less than this value, there is the possibility that the growth distance of the laterally grown regions does not reach a desired length (FIG. 6A).

Under this condition, a heat treatment is performed for crystallization. In the present embodiment, the heat treatment is made at 600° C. for 8 hours to achieve sufficient lateral growth. Thus, in regions becoming peripheral circuits, a nickel-doped region (that can also be referred to as a vertically grown region) 606 and a laterally grown region 607 are formed. In regions becoming the pixel matrix circuit, the whole surface of the amorphous silicon film 602 is crystallized, thus forming a vertically grown region 608 (FIG. 6B).

After removing the mask insulator film 603, a resist mask 609 provided with openings 610–612 is formed. P ions are implanted to form P-doped regions 613–615 (FIG. 6C).

In the same way as in the first, second, and third embodiments, the phosphorus-doped regions 613 and 614 act as gettering regions that collect nickel. The phosphorus-doped region 615 serves as the lower electrode of an auxiliary capacitor. Of course, the phosphorus-doped region 615 acts also as a gettering region. As a result, a state as shown in FIG. 6C is obtained. Subsequently, the process sequence is carried out in the same way as in the first and second embodiments to manufacture a semiconductor device.

A fifth embodiment of the present invention is now described. In this embodiment, vertically grown regions and the laterally grown regions are used for separate purposes with a structure different from the structure of the fourth embodiment. The process sequence is described again only up to the gettering step using phosphorus element.

Referring to FIG. 7A, there are shown a substrate 701 and an amorphous silicon film 702. Where the second embodiment is used, the substrate is a quartz substrate. In the present embodiment, a peripheral circuit is composed of vertically grown regions. A pixel matrix circuit is composed of laterally grown regions. Therefore, a mask insulator film 703 is not formed in regions 1 becoming the peripheral circuit. Openings 704 are formed at required locations in regions 2 becoming the pixel matrix circuit.

A solution containing nickel is applied and a nickel-containing layer 705 is formed by spin coating. At this time, the nickel concentration of the solution is set to 100 ppm by weight in the same way as in the fourth embodiment described above (FIG. 7A).

Under this condition, a heat treatment is performed for crystallization. In the present embodiment, the heat treatment is made at 600° C. for 8 hours to achieve sufficient lateral growth. Thus, in regions becoming a pixel matrix circuit, a vertically grown region 706 and a laterally grown region 707 are formed, using introduction of nickel. In regions becoming the peripheral circuits, the whole surface of the amorphous silicon film 702 is crystallized, thus forming a vertically grown region 708 (FIG. 7B).

After removing the mask insulator film 703, a resist mask 709 provided with openings 710–712 is formed. P ions are implanted to form P-doped regions 713–715 (FIG. 7C).

In the same way as in the first through fourth embodiments, the phosphorus-doped regions 713 and 714 act as gettering regions that collect nickel. The phosphorus-doped region 715 serve as the lower electrode of an auxiliary capacitor. Of course, the phosphorus-doped region 715 acts also as a gettering region. As a result, a state as shown in FIG. 7C is obtained. Subsequently, the process sequence is carried out in the same way as in the first or second embodiment to manufacture a semiconductor device.

A sixth embodiment of the present invention gives an example in which the region forming the lower electrode of the auxiliary capacitor is exploited as a nickel-doped region. The process sequence of the present embodiment is described again up to the gettering step using phosphorus element.

Referring to FIG. 8A, there are shown a substrate 801 and an amorphous silicon film 802. Where the second embodiment is used, the substrate is a quartz substrate. A mask insulator film 803 is formed on the amorphous silicon film 802. Openings 804 and 805 are formed in the mask insulator film 803. The present embodiment is characterized in that the opening 805 is formed in a region that will become the lower electrode of the auxiliary capacitor later.

A solution containing nickel is applied and a nickel-containing layer 806 is formed by spin coating. At this time, the nickel concentration of the solution is set to 100 ppm by weight in the same way as in the fourth and fifth embodiments described above (FIG. 8A).

Under this condition, a heat treatment is performed for crystallization. In the present embodiment, the heat treatment is made at 570° C. for 14 hours. The crystallization temperature is lowered to 560° C. in this way, whereby crystallization due to spontaneous nucleation can be prevented sufficiently; otherwise lateral crystal growth would be stopped there.

In regions becoming peripheral circuits, this thermal treatment produces a nickel-doped, vertically grown region 807 and a nickel-doped, laterally grown region 808. In addition, in the regions becoming the pixel matrix circuit, a nickel-doped vertically grown region 809 and a laterally grown region 810 are produced (FIG. 8B).

Then, as shown in FIG. 8C, P ions are implanted while using the mask insulator film 803 as a mask intact. Thus, phosphorus-doped regions 811 and 812 are formed. Then, the process sequence is performed in the same way as in the first and second embodiments described above to manufacture a semiconductor device.

In the present embodiment, the mask insulator film 803 already used for introduction of nickel can be used intact as a mask for a phosphorus implant. Consequently, the manufacturing process can be simplified.

A seventh embodiment of the invention gives an example in which no nickel is introduced into the pixel matrix circuit at all. In this configuration, the peripheral circuit may be made either of vertically grown regions or of laterally grown regions. In the present embodiment, the peripheral circuit consists of laterally grown regions.

Referring to FIG. 9A, there are shown a substrate 901, an amorphous silicon film 902, and a mask insulator film 903. In the present embodiment, in regions 1 becoming peripheral circuits, openings 904 are formed in the mask insulator film 903. No openings are formed in regions 2 becoming the pixel matrix circuit.

A solution containing nickel is applied and a nickel-containing layer 905 is formed by spin coating. At this time, the nickel concentration of the solution is set to 100 ppm by weight (FIG. 9A).

Under this condition, a heat treatment is conducted for crystallization. In the present embodiment, this crystallization step is performed at 560° C. for 20 hours. This heat treatment forms a vertically grown region 906 and a laterally grown region 907 owing to nickel implants. An amorphous region 908 is left in regions becoming the pixel matrix circuit because no nickel is implanted at all (FIG. 9B).

After removing the mask insulator film 903, a resist mask 909 provided with openings 910 and 911 is formed. P ions are introduced to form phosphorus-doped regions 912 and 913. At this time, these phosphorus-doped regions 912 and 913 are once rendered amorphous (FIG. 9C).

Then, a heat treatment is made at 600° C. for about 24 hours to carry out a gettering step using phosphorus element. This process step getters the nickel contained in the laterally grown region 914 into a phosphorus-doped region 915 (FIG. 10A).

The phosphorus-doped region 915 becoming a gettering region is recrystallized by the heat treatment. In addition, a phosphorus-doped region 916 acting as the lower electrode of an auxiliary capacitor later is recrystallized by this heat treatment.

Spontaneous nucleation promotes the crystallization of the amorphous region 908, which in turn becomes a crystalline region 917. In this way, the phosphorus-doped region 916 becoming the lower electrode of the auxiliary capacitor does not act as a gettering region and so this region 916 contains almost no nickel.

After obtaining the state of FIG. 10A, the film is patterned to etch away unnecessary portions. In this manner, islands of active layer 918–920 are formed. Then, a gate insulator film 921 is formed by process steps described in the first embodiment. The resulting state is shown in FIG. 10B. Thereafter, a semiconductor device is manufactured by process steps similar to those of the first embodiment.

An eighth embodiment of the present invention gives an example in which no nickel is implanted at all into the pixel matrix circuit. In this configuration, the peripheral circuit may be made either of vertically grown regions or of laterally grown regions. In the present embodiment, the peripheral circuit consists of laterally grown regions.

Referring to FIG. 13A, there are shown a quartz substrate 1301, an amorphous silicon film 1302, and a mask insulator film 1303. In the present embodiment, in regions becoming peripheral circuits, openings 1304 are formed in the mask insulator film 1303. No openings are formed in regions becoming the pixel matrix circuit.

A solution containing nickel is applied and a nickel-containing layer 1305 is formed by spin coating. At this time, the nickel concentration of the solution is set to 100 ppm by weight (FIG. 13A).

Under this condition, a heat treatment is conducted for crystallization. In the present embodiment, the crystallization step is performed at 560° C. for 20 hours. This heat treatment forms a vertically grown region 1306 and a laterally grown region 1307 owing to nickel implants in the regions 1 becoming the peripheral circuits. An amorphous region 1308 is left in regions 2 becoming the pixel matrix circuit because no nickel is implanted at all (FIG. 13B).

After removing these mask insulator film 1303, a resist mask 1309 provided with openings 1310 and 1311 is formed. P ions are introduced to form phosphorus-doped regions 1312 and 1313. At this time, these phosphorus-doped regions 1312 and 1313 are once rendered amorphous (FIG. 13C).

Then, a heat treatment is made at 600° C. for about 8 to 24 hours to carry out a gettering step using phosphorus element. This process step getters the nickel contained in the laterally grown region 1314 into a phosphorus-doped region 1315 (FIG. 14A).

The phosphorus-doped region 1315 becoming a gettering region is recrystallized by the heat treatment. In addition, a phosphorus-doped region 1316 acting as the lower electrode of an auxiliary capacitor later is recrystallized by this heat treatment.

The crystallization of the amorphous region 1308 progresses and this region becomes a crystalline region 1317. The extent to which the amorphous region crystallizes varies according to the heat treatment conditions. However, it may be considered that if the heat treatment is effected at 600° C. for more than 12 hours, the amorphous region crystallizes almost totally.

Then, a heat treatment is made in an ambient containing a halogen element. The action of the halogen element getters nickel. The conditions of this heat treatment are described in the first embodiment. At this time, the phosphorus-doped regions 1315 and 1316 have been already crystallized and, therefore, the thermal diffusion of phosphorus element is not large enough to induce problems (FIG. 14B).

A laterally grown region 1318 obtained by this process step has a peculiar crystal structure consisting of rodlike or flat rodlike crystals as described in the first embodiment. This region 1318 is a crystalline silicon film having excellent crystallinity.

The nickel collected in the phosphorus-doped region 1319 by the gettering step using the phosphorus element is almost fully gettered into a gaseous phase. Hence, this region 1319 is almost free of nickel.

A region 1320 has been already crystallized by the aforementioned heat treatment. Therefore, the crystallinity is improved greatly by a heat treatment at an elevated temperature. Experiment has proved that if the amorphous region is directly heat-treated as illustrated in FIG. 14B, the crystallinity of the resulting crystalline region is very poor. That is, where TFTs are fabricated, their electrical characteristics are poor.

After obtaining the state of FIG. 14B, the film is patterned to etch away portions excluding required portions. In this manner, islands of active layer 1321–1323 are formed. Then, a gate insulator film 1324 is formed by process steps described in the first embodiment. The resulting state is shown in FIG. 14C. Thereafter, a semiconductor device is manufactured by process steps similar to those of the second embodiment.

A ninth embodiment of the present invention gives an example in which lamp annealing is used as a heating method during the gettering step using phosphorus element as illustrated in FIG. 2A or 12A. RTA (rapid thermal annealing) is known as thermal processing using lamp annealing. In this technique, infrared light emitted by a halogen lamp or the like is directed at a sample to heat a thin film.

Where RTA is used as the thermal processing during the gettering step, a high-temperature annealing at 700 to 1100° C. can be completed in a short time of several seconds to several minutes. Since the temperature can be elevated compared with the case of furnace annealing, the gettering effect of the catalytic element is improved. Also, the processing time is much shorter. As a consequence, the throughput is improved greatly.

Additionally, the thermal treatment at high temperatures of 700 to 1100° C. realigns the silicon atoms existing near the grain boundaries in the crystalline silicon film. This promotes the passivation of the grain boundaries. That is, the crystal defects such as dangling bonds are reduced greatly, and fewer carriers are captured. As a whole, the crystallinity is improved drastically.

A tenth embodiment of the present invention gives an example in which ion implantation is employed in introducing a catalytic element (typically nickel). Preferably, the dose is adjusted to $0.5 \times 10^{13}$ to $1 \times 10^{15}$ atoms/cm$^2$ (preferably $2 \times 10^{13}$ to $2 \times 10^{14}$ atoms/cm$^2$).

Where a catalytic element is implanted by ion implantation as in the present embodiment, the width, or the shorter side, of each opening is approximately 0.01 to 5 μm (typically 0.25 to 2 μm). That is, a sufficient amount of nickel can be introduced into the openings delineated by a fine-line pattern. Therefore, the area occupied by the implanted catalytic element that forms a dead space in designing the circuitry can be reduced greatly. This increases the number of degrees of freedom in designing the circuitry.

In the first and second embodiments described above, the gate electrode consists only or mainly of aluminum. An eleventh embodiment of the invention gives an example in which the gate electrode uses a crystalline silicon film having one conductivity type. In addition, the gate electrode may be made of a metal material (such as titanium, tantalum, tungsten, or molybdenum) or a silicide of such a metal material, i.e., a compound of silicon.

In the first through eleventh embodiments, a planar TFT is used as a typical TFT structure. The invention can also be applied to a bottom-gate type TFT such as inverted-staggered TFT. Furthermore, the invention is applicable to MOSFETs fabricated on a silicon wafer, as well as to ordinary TFTs. In this way, the invention can be applied to every kind of semiconductor device, regardless of its structure. The invention is not limited to semiconductor devices of certain structures.

Figure 15:
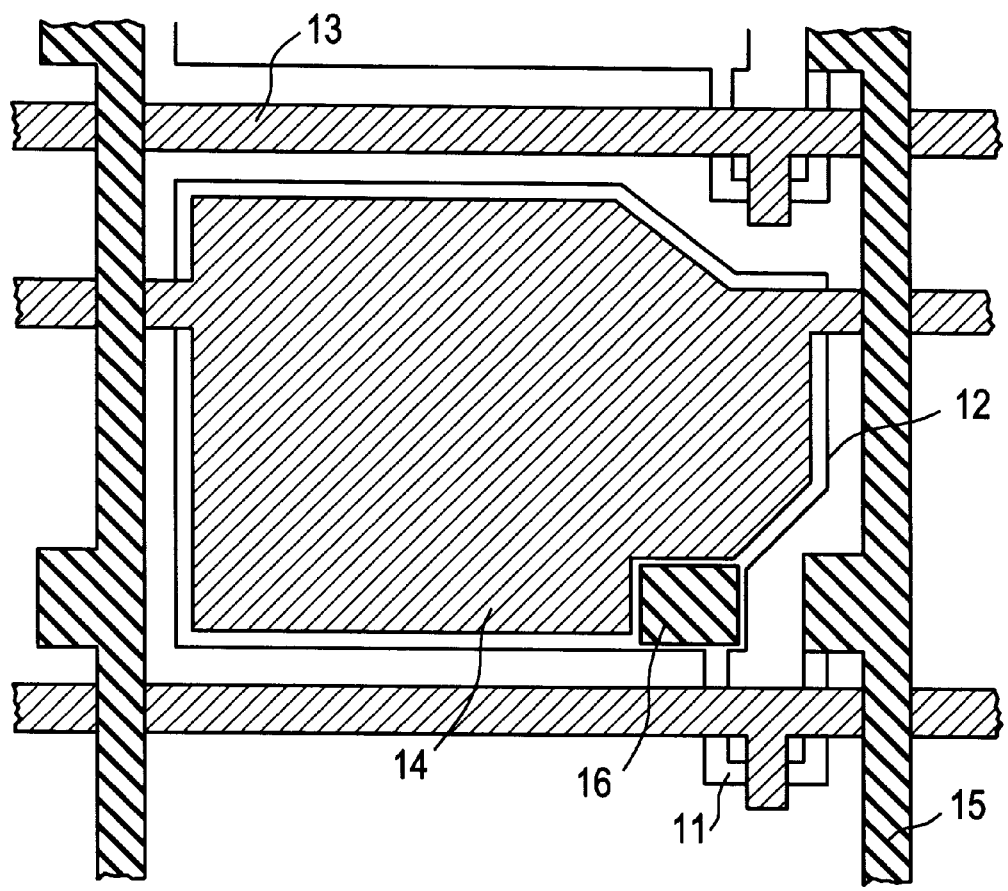
FIG. 15 is a top plan view of a pixel region of a semiconductor device in accordance with the invention.

A thirteenth embodiment of the present invention gives an example of pixel array forming a pixel matrix circuit. This example is shown in FIG. 15. However, for simplicity, the pixel electrodes are not shown.

Referring to FIG. 15, an active layer 11 corresponds to the active layer 119 shown in FIG. 2C and to the active layer 1122 of FIG. 12C. In the present embodiment, the drain side of the active layer 11 extends throughout each pixel and acts also as the lower electrode 12 of an auxiliary capacitor.

A gate line 13 is located over the active layer 11 via a gate insulator film. The gate line 13 corresponds to the gate electrode 135 of FIG. 3B. Apart from the gate line 13, the upper electrode 14 of the auxiliary capacitor is formed and corresponds to the upper electrode 136 of FIG. 3B.

The pattern of the upper electrode 14 substantially conforms to the pattern of the active layer becoming the lower electrode. The upper electrode 14 forms the auxiliary capacitor occupying an area substantially equal to the area occupied by the pixel. The upper electrode 14 is electrically connected between adjacent pixels. The upper electrode 14 is connected in a parallel relation to the gate line so as not to cross the gate line. That is, the upper electrode of the auxiliary capacitor is maintained at the same potential for every pixel.

Then, a source electrode (source line) 15 and a drain electrode 16 are formed over the gate line 13 and over the upper electrode 14 of the auxiliary capacitor via a first interlayer dielectric film. These electrodes correspond to the source electrode 165 and the drain electrode 167, respectively, of FIG. 4B.

Thereafter, the interlayer dielectric film 168 and pixel electrodes 169 are formed as shown in FIG. 4C. Then, a well-known cell assembly step is carried out. In this way, a reflective liquid crystal display is completed. The structure according to the present embodiment makes it possible to secure sufficient capacitance by making a maximum use of the pixel area even if this area is reduced.

A fourteenth embodiment of the invention gives an example in which the present invention is applied to a transmissive liquid crystal display. The process sequence for fabricating TFTs is fundamentally the same as the process sequence described in the first and second embodiments and so detailed description of this process sequence is omitted.

In the first and second embodiments described above, the pixel electrode consists mainly of aluminum. In the present embodiment, however, an ITO film is made of a transparent conductive film. For the transmissive type, it is important to have a large aperture ratio. Therefore, the electric field-shielding film and the black matrix may be formed only in required locations in minimum size.

Figure 16:
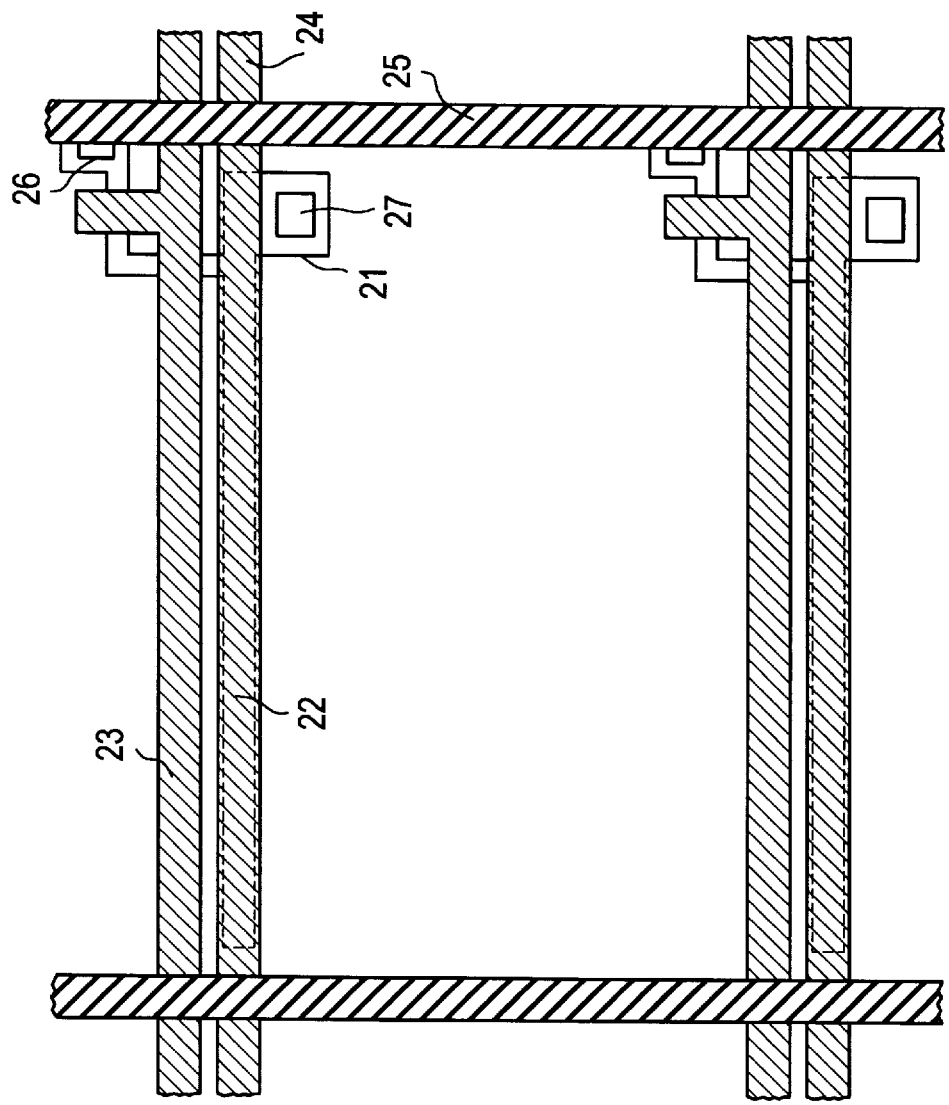
FIG. 16 is a top plan view of a pixel region of another semiconductor device in accordance with the invention.

FIG. 16 is a top plan view of a transmissive liquid crystal display according to the present embodiment. For ease of understanding, in this top plan view, source/drain electrodes are shown to be formed. Accordingly, the pixel electrodes, the field-shielding film, the black matrix, and so on are omitted.

Referring to FIG. 16, an active layer 21 has a drain region where the lower electrode 22 of an auxiliary capacitor is formed. A gate electrode (gate line) 23 overlies the active layer 21. The upper electrode 24 of the auxiliary capacitor is located on the lower electrode 22. Since the lower electrode 22 is covered with the upper electrode 24, the lower electrode 22 is indicated by the broken lines. Of course, a gate insulator film is held between the lower electrode 22 and the upper electrode 24 to form an auxiliary capacitor.

A source electrode (source line) 25 is formed so as to intersect the gate electrode 23 and the upper electrode 24. This source electrode 25 is electrically connected with the source region of the active layer 21 in a contact portion 26.

In practice, a black matrix is formed so as to shield the active layer and the various conducting lines. Otherwise, an electric field-shielding film is formed between the upper and lower layers of metallization. A pixel electrode (not shown) is electrically connected with the drain region of the active layer 21 in a contact portion 27. The structure described thus far permits fabrication of a transmissive liquid crystal display. Obviously, the invention is not limited to the structure shown in FIG. 16.

Figure 17:
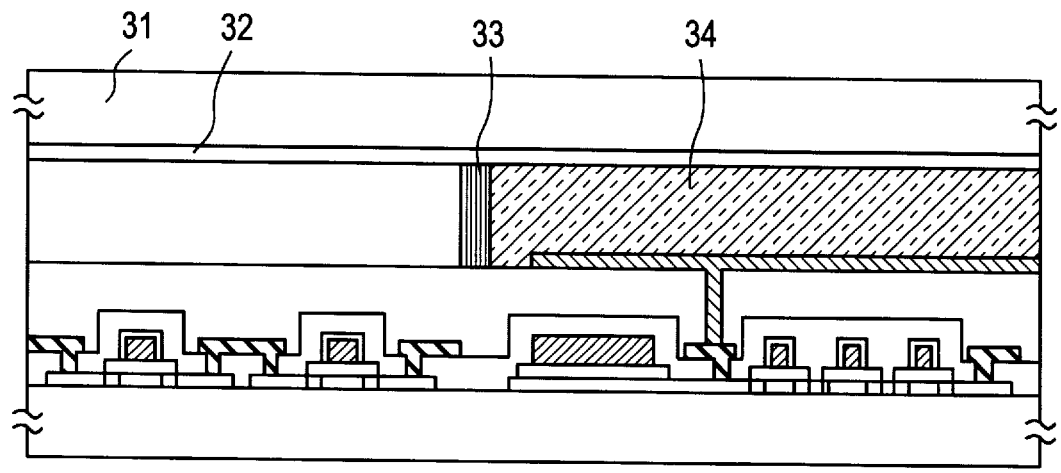
FIG. 17 is a fragmentary cross section of a liquid crystal display in accordance with the invention.

A fifteenth embodiment of the invention is a simplified form of the reflective liquid crystal display described in the first or second embodiment. A cross section of this simplified display is shown in FIG. 17. Since the active matrix display device has been already described in the first and second embodiments, other structures are described below.

Referring to FIG. 17, there are shown a transparent substrate 31 and a transparent conductive film 32. Color filters, an orientation film, and a black matrix (none of which are shown) may be formed on the transparent substrate 31. This subassembly is referred to as the counter substrate.

A liquid crystal material 34 is sandwiched between the counter substrate and the active matrix display substrate and surrounded by a seal material 33. Since the present invention can accommodate every mode of operation such as ECB mode and guest-host mode, the liquid crystal material may be changed accordingly. Depending on the mode of operation, color filters may be necessary. Furthermore, depending on the mode of operation, polarizers may be needed.

In the present embodiment, no liquid crystal layer is disposed over the peripheral circuit to prevent parasitic capacitance between the peripheral circuit and the opposite transparent conductive film 32. Of course, a liquid crystal layer may be formed over the whole surface of the substrate.

Figure 18:
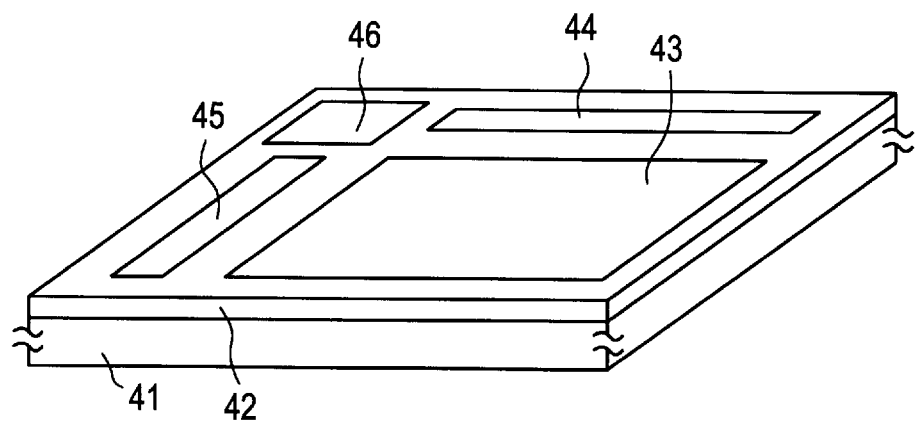
FIG. 18 is a perspective view of an active matrix display substrate in accordance with the invention.

FIG. 18 shows one example of arrangement of various circuits formed on the active matrix display substrate. There are shown a substrate 41, a buffer film 42, a pixel matrix circuit 43, a source driver circuit 44, a gate driver circuit 45, and a logic circuit 46.

The reflective liquid crystal display has been outlined. The transmissive liquid crystal display is essentially identical in structure with this reflective liquid crystal display. In this way, the invention can be applied to any liquid crystal display structure.

A sixteenth embodiment of the invention is an electrooptical device different from a liquid crystal display. Examples of this electrooptical device include electroluminescent device and electrochromic display.

A seventeenth embodiment of the present invention gives examples of commercial products using electrooptical devices. These examples are shown in FIGS. 19A–19F. Examples of commercial products utilizing the present invention include video camera, still camera, projector, head mount display, car navigational system, personal computer, portable intelligent terminals (such as mobile computers and portable telephones).

Figure 19A:
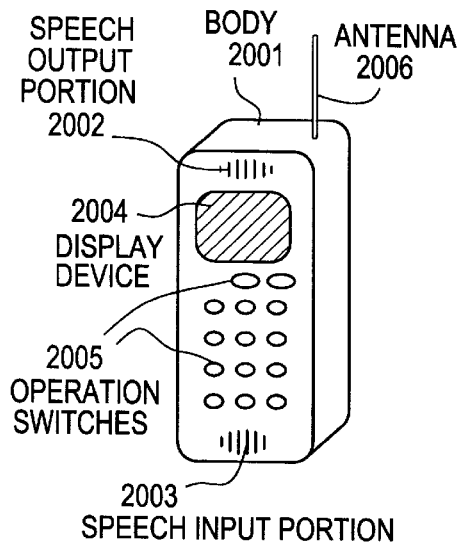
FIGS. 19A–19F are views illustrating commercial products to which the invention is applied.

Referring next to FIG. 19A, there is shown a mobile telephone whose body is indicated by 2001. The body 2001 has a speech output portion 2002, a speech input portion 2003, a display device 2004, and operation switches 2005. An antenna 2006 is attached to the body 2001. The present invention can be applied to the display device 2004.

Figure 19B:
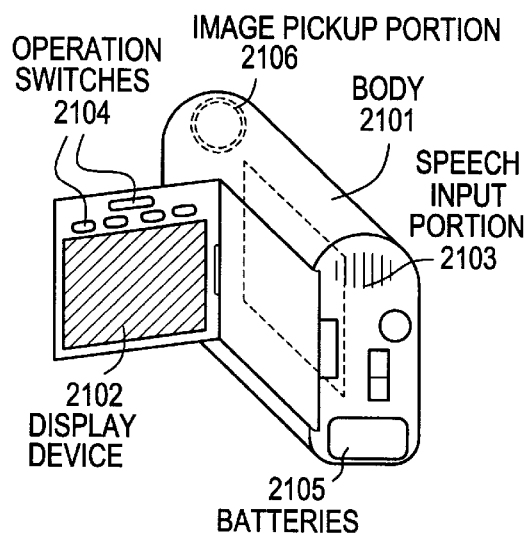

Referring to FIG. 19B, there is shown a video camera whose body is indicated by 2101. This body 2101 has a display device 2102, a speech input portion 2103, operation switches 2104, batteries 2105, and an image pickup portion 2106. The invention can be applied to the display device 2102.

Figure 19C:
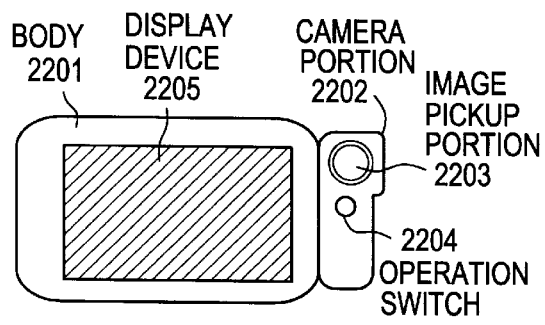

Referring to FIG. 19C, the body of a mobile computer is indicated by 2201. This body 2201 has a display device 2205. A camera portion 2202 having both an image pickup portion 2203 and an operation switch 2204 is attached to the body 2201. The invention is applied to the display device 2205.

Figure 19D:
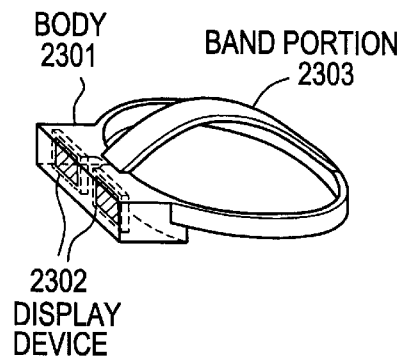

Referring to FIG. 19D, the body of a head mount display is indicated by 2301 and has display devices 2302. A band portion 2303 is attached to the body 2301. The invention is applied to the display devices 2302.

Figure 19E:
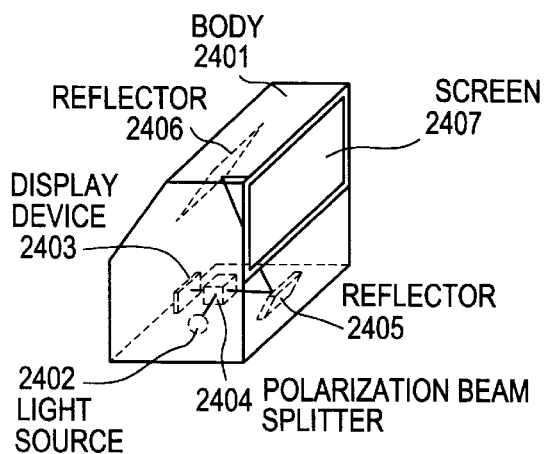

Referring to FIG. 19E, there is shown a rear projection system whose body is indicated by 2401. The body 2401 has a light source 2402, a display device 2403, a polarizing beam splitter 2404, and reflectors 2405, 2406. A screen 2407 is positioned on the body 2401. The invention is applied to the display device 2403.

Figure 19F:
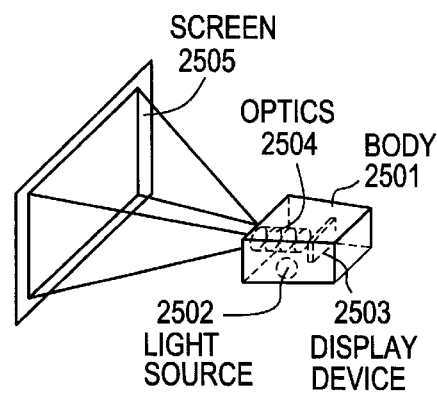

Referring to FIG. 19F, there is shown a front projection system comprising a display body 2501 and a screen 2505 located in front of it. This body 2501 has a light source 2502, a display device 2503, and optics 2504. The invention is applied to the display device 2503.

As described thus far, the present invention can find quite extensive application and is applicable to display media in every technical field. Especially, where a liquid crystal display is used in a projection display such as a projector, very high resolution is required. In such cases, the invention provides very useful techniques.

In the present invention, the step for forming regions for gettering a catalytic element is made common with the step for forming the lower electrode of the auxiliary capacitor. This simplifies the manufacturing process. In consequence, the throughput and the yield are improved. This is economically advantageous.

Furthermore, a crystalline film produced by making use of the present invention has excellent crystallinity by the effect of a catalytic element. The gettering effect removes or reduces the catalytic element. Therefore, where the crystalline film is used as the active layer of a semiconductor device, excellent electrical characteristics and high reliability are imparted to the semiconductor device.

What is claimed is:

1. A method of fabricating a semiconductor device, comprising the steps of:

forming an amorphous film containing silicon;

preparing a catalytic element for promoting crystallization of said silicon;

maintaining said catalytic element in contact with at least parts of said amorphous film or introducing said catalytic element into said at least parts of said amorphous film;

heat-treating said amorphous film to crystallize portions of said amorphous film that will become active components;

preparing a chemical element selected from group 15 of the periodic table;

introducing said chemical element into regions adjacent to said portions of said film becoming the active components and simultaneously into regions becoming a lower electrode of each auxiliary capacitor;

irradiating a laser light to said film after said introducing step of said chemical element; and heat-treating said film after said irradiating step to getter said catalytic element into regions doped with said chemical element selected from group 15.

2. A method of fabricating a semiconductor device, comprising the steps of:

forming an amorphous film containing silicon;

preparing a catalytic element for promoting crystallization of said silicon;

maintaining said catalytic element in contact with at least parts of said amorphous film or introducing said catalytic element into said at least parts of said amorphous film;

heat-treating said amorphous film to crystallize portions of said amorphous film that will become active components;

preparing a chemical element selected from group 15 of the periodic table;

introducing said chemical element into regions adjacent to said portions of said film becoming the active components and simultaneously into regions becoming a lower electrode of each auxiliary capacitor;

irradiating a laser light to said film after said introducing step of said chemical element; and heat-treating said film after said irradiating step to getter said catalytic element into regions doped with said chemical element selected from group 15, wherein said laser light is selected from the group consisting of YAG laser light, KrF excimer laser light, ArF excimer laser light, XeCl excimer laser light and $CO_2$ laser light.

3. A method of fabricating a semiconductor device, comprising the steps of:

forming an amorphous film containing silicon;

preparing a catalytic element for promoting crystallization of said silicon;

maintaining said catalytic element in contact with at least parts of said amorphous film or introducing said catalytic element into said at least parts;

heat-treating said amorphous film to crystallize portions of said amorphous film becoming active components;

introducing a chemical element selected from group 15 into regions adjacent to said portions of said film becoming active components and simultaneously into regions becoming a lower electrode of each auxiliary capacitor;

irradiating a laser light to said film after said introducing step of said chemical element; and heat-treating said film to getter said catalytic element into regions doped with said chemical element selected from group 15; and heat-treating said film in an ambient containing a halogen element to getter said catalytic element into said ambient.

4. A method of fabricating a semiconductor device, comprising the steps of:

forming an amorphous film containing silicon;

preparing a catalytic element for promoting crystallization of said silicon;

maintaining said catalytic element in contact with at least parts of said amorphous film or introducing said catalytic element into said at least parts;

heat-treating said amorphous film to crystallize portions of said amorphous film becoming active components;

introducing a chemical element selected from group 15 into regions adjacent to said portions of said film becoming active components and simultaneously into regions becoming a lower electrode of each auxiliary capacitor;

irradiating a laser light to said film after said introducing step of said chemical element; and heat-treating said film to getter said catalytic element into regions doped with said chemical element selected from group 15; and heat-treating said film in an ambient containing a halogen element to getter said catalytic element into said ambient, wherein said laser light is selected from the group consisting of YAG laser light, KrF excimer laser light, ArF excimer laser light, XeCl excimer laser light and $CO_2$ laser light.

5. A method of fabricating a semiconductor device, comprising the steps of:

forming an amorphous film containing silicon;

forming an insulator film having a first opening on said amorphous film;

preparing a catalytic element for promoting crystallization of said silicon;

maintaining said catalytic element in contact with said amorphous film or introducing said catalytic element into said amorphous film while using said insulator film as a mask;

heat-treating said amorphous film to crystallize portions of said amorphous film that will become active components;

forming a second opening in said insulator film;

preparing a chemical element selected from group 15 of the periodic table;

introducing said chemical element into regions exposed through bottoms of said first and second openings in the crystallized film simultaneously;

irradiating a laser light to said film after said introducing step of said chemical element;

heat-treating said film to getter said catalytic element into regions doped with said chemical element selected from group 15; and heat-treating said amorphous film in an ambient containing a halogen element to getter said catalytic element into said ambient.

6. A method of fabricating a semiconductor device, comprising the steps of:

forming an amorphous film containing silicon;

forming an insulator film having a first opening on said amorphous film;

preparing a catalytic element for promoting crystallization of said silicon;

maintaining said catalytic element in contact with said amorphous film or introducing said catalytic element into said amorphous film while using said insulator film as a mask;

heat-treating said amorphous film to crystallize portions of said amorphous film that will become active components;

forming a second opening in said insulator film;

preparing a chemical element selected from group 15 of the periodic table;

introducing said chemical element into regions exposed through bottoms of said first and second openings in the crystallized film simultaneously;

irradiating a laser light to said film after said introducing step of said chemical element;

heat-treating said film to getter said catalytic element into regions doped with said chemical element selected from group 15; and heat-treating said film in an ambient containing a halogen element to getter said catalytic element into said ambient, wherein said laser light is selected from the group consisting of YAG laser light, KrF excimer laser light, ArF excimer laser light, XeCl excimer laser light and $CO_2$ laser light.

7. A method of fabricating a semiconductor device, comprising the steps of:

forming an amorphous film containing silicon;

forming an insulating film having a first opening on said amorphous film;

preparing a catalytic element for promoting crystallization of said silicon;

maintaining said catalytic element in contact with said amorphous film or introducing said catalytic element into said amorphous film while using said insulator film as a mask;

heat-treating said amorphous film to crystallize portions of said amorphous film that will become active components;

forming a second opening in said insulator film;

preparing a chemical element selected from group 15 of the periodic table;

introducing said chemical element into regions exposed through bottoms of said first and second openings in the crystallized film;

irradiating a laser light to said film after said introducing step of said chemical element; and heat-treating said film to getter said catalytic element into regions doped with said chemical element selected from group 15.

8. A method of fabricating a semiconductor device, comprising the steps of:

forming an amorphous film containing silicon;

forming an insulating film having a first opening on said amorphous film;

preparing a catalytic element for promoting crystallization of said silicon;

maintaining said catalytic element in contact with said amorphous film or introducing said catalytic element into said amorphous film while using said insulator film as a mask;

heat-treating said amorphous film to crystallize portions of said amorphous film that will become active components;

forming a second opening in said insulator film;

preparing a chemical element selected from group 15 of the periodic table;

introducing said chemical element into regions exposed through bottoms of said first and second openings in the crystallized film;

irradiating a laser light to said film after said introducing step of said chemical element; and heat-treating said film to getter said catalytic element into regions doped with said chemical element selected from group 15;

wherein said laser light is selected from the group consisting of YAG laser light, KrF excimer laser light, ArF excimer laser light, XeCl excimer laser light and $CO_2$ laser light.

9. A method of fabricating a semiconductor device, comprising the steps of:

forming an amorphous film containing silicon;

preparing a catalytic element for promoting crystallization of said silicon;

maintaining said catalytic element in contact with at least parts of said amorphous film or introducing said catalytic element into said at least parts of said amorphous film;

heat-treating said amorphous film to crystallize portions of said amorphous film that will become active components;

preparing a chemical element selected from group 15 of the periodic table;

introducing said chemical element into regions adjacent to said portions of said amorphous film becoming the active components and simultaneously into regions becoming a lower electrode of each auxiliary capacitor; and heat-treating said amorphous film to getter said catalytic element into regions doped with said chemical element selected from group 15.

10. The method of claim 9, wherein said step of introducing said chemical element into said regions forms gettering regions and the lower electrode of each auxiliary capacitor.

11. The method of claim 9, wherein said catalytic element is at least: one element selected from the group consisting of Ni, Co, Fe, Pd, Pt, Cu, and Au.

12. The method of claim 9, wherein said catalytic element is introduced by ion implantation.

13. The method of claim 9, wherein said chemical element selected from group 15 is at least one element selected from the group consisting of P, As, Sb, and Bi.

14. The method of claim 9, wherein said step of introducing said chemical element is carried out by ion implantation or plasma doping.

15. The method of claim 9, wherein said step of introducing said chemical element selected from group 15 is carried out with a dose of $1\times10^{13}$ to $8\times10^{15}$ atoms/cm$^2$.

16. The method of claim 9, wherein said step of heat-treating said amorphous film to getter said catalytic element using said chemical element is carried out at a temperature of 500–700° C.

17. The method of claim 9, wherein said semiconductor device is an electroluminescent device.

18. The method of claim 9, wherein said semiconductor device is one of a mobile telephone, a video camera, a mobile computer, a head mount display, a rear projection and a front projection.

19. A method of fabricating a semiconductor device, comprising the steps of:

forming an amorphous film containing silicon;

forming an insulating film having a first opening on said amorphous film;

preparing a catalytic element for promoting crystallization of said silicon;

maintaining said catalytic element in contact with said amorphous film or introducing said catalytic element into said amorphous film while using said insulator film as a mask;

heat-treating said amorphous film to crystallize portions of said amorphous film that will become active components;

forming a second opening in said insulator film;

preparing a chemical element selected from group 15 of the periodic table;

introducing said chemical element into regions exposed through bottoms of said first and second openings in the crystallized film; and heat-treating said amorphous film to getter said catalytic element into regions doped with said chemical element selected from group 15.

20. The method of claim 19, wherein said second opening is formed over regions becoming the lower electrode of each auxiliary capacitor.

21. The method of claim 19, wherein said step of introducing said chemical element into said regions forms gettering regions and the lower electrode of each auxiliary capacitor.

22. The method of claim 19, wherein said catalytic element is at least one element selected from the group consisting of Ni, Co, Fe, Pd, Pt, Cu, and Au.

23. The method of claim 19, wherein said catalytic element is introduced by ion implantation.

24. The method of claim 19, wherein said chemical element selected from group 15 is at least one element selected from the group consisting of P, As, Sb, and Bi.

25. The method of claim 19, wherein said step of introducing said chemical element is carried out by ion implantation or plasma doping.

26. The method of claim 19, wherein said step of introducing said chemical element selected from group 15 is carried out with a dose of $1\times10^{13}$ to $8\times10^{15}$ atoms/cm$^2$.

27. The method of claim 19, wherein said step of heat-treating said amorphous film to getter said catalytic element using said chemical element is carried out at a temperature of 500–700° C.

28. The method of claim 19, wherein said semiconductor device is an electroluminescent device.

29. The method of claim 19, wherein said semiconductor device is one of a mobile telephone, a video camera, a mobile computer, a head mount display, a rear projection and a front projection.

30. A method of fabricating a semiconductor device having peripheral circuits and a pixel matrix circuit on a common substrate, said method comprising the steps of:

forming an amorphous film containing silicon;

preparing a catalytic element for promoting crystallization of said silicon;

maintaining said catalytic element in contact with at least parts of regions of said amorphous film becoming said peripheral circuits or introducing said catalytic element into said at least parts of the regions;

heat-treating said amorphous film to crystallize portions of said amorphous film that will become active components of said peripheral circuits;

preparing a chemical element selected from group 15 of the periodic table;

introducing said chemical element into regions adjacent to said portions of said amorphous film becoming said active components and simultaneously into regions becoming a lower electrode of each auxiliary capacitor; and heat-treating said amorphous film to getter said catalytic element into regions doped with said chemical element selected from group 15.

31. The method of claim 30, wherein said step of introducing said chemical element into said regions forms gettering regions and the lower electrode of each auxiliary capacitor.

32. The method of claim 30, wherein said catalytic element is at least one element selected from the group consisting of Ni, Co, Fe, Pd, Pt, Cu, and Au.

33. The method of claim 30, wherein said catalytic element is introduced by ion implantation.

34. The method of claim 30, wherein said chemical element selected from group 15 is at least one element selected from the group consisting of P, As, Sb, and Bi.

35. The method of claim 30, wherein said step of introducing said chemical element is carried out by ion implantation or plasma doping.

36. The method of claim 30, wherein said step of introducing said chemical element selected from group 15 is carried out with a dose of $1 \times 10^{13}$ to $8 \times 10^{15}$ atoms/cm$^2$.

37. The method of claim 30, wherein said step of heat-treating said amorphous film to getter said catalytic element using said chemical element is carried out at a temperature of 500–700° C.

38. The method of claim 30, wherein said semiconductor device is an electroluminescent device.

39. The method of claim 30, wherein said semiconductor device is one of a mobile telephone, a video camera, a mobile computer, a head mount display, a rear projection and a front projection.

40. A method of fabricating a semiconductor device, comprising the steps of:

forming an amorphous film containing silicon;

preparing a catalytic element for promoting crystallization of said silicon;

maintaining said catalytic element in contact with at least parts of said amorphous film or introducing said catalytic element into said at least parts;

heat-treating said amorphous film to crystallize portions of said amorphous film becoming active components;

introducing a chemical element selected from group 15 into regions adjacent to said portions of said amorphous film becoming active components and simultaneously into regions becoming a lower electrode of each auxiliary capacitor;

heat-treating said amorphous film to getter said catalytic element into regions doped with said chemical element selected from group 15; and heat-treating said amorphous film in an ambient containing a halogen element to getter said catalytic element into said ambient.

41. The method of claim 40, wherein said step of introducing said chemical element into said regions forms gettering regions and the lower electrode of each auxiliary capacitor.

42. The method of claim 40, wherein said catalytic element is at least one element selected from the group consisting of Ni, Co, Fe, Pd, Pt, Cu, and Au.

43. The method of claim 40, wherein said step of introducing said catalytic element is carried out by ion implantation.

44. The method of claim 40, wherein said chemical element selected from group 15 of the periodic table is at least one element selected from the group consisting of P, As, Sb, and Bi.

45. The method of claim 40, wherein said step of introducing said chemical element selected from group 15 is carried out by ion implantation or plasma doping.

46. The method of claim 40, wherein said step of introducing said chemical element selected from group 15 is carried out with a dose of $1 \times 10^{13}$ to $8 \times 10^{15}$ atoms/cm$^2$.

47. The method of claim 40, wherein said step of heat-treating said amorphous film to getter said catalytic element using said chemical element is carried out at a temperature of 500 to 700° C., and wherein said step of heat-treating said amorphous film in an ambient containing a halogen element to getter said catalytic element is carried out at a temperature of 700 to 1100° C.

48. The method of claim 40, wherein said semiconductor device is an electroluminescent device.

49. The method of claim 40, wherein said semiconductor device is one of a mobile telephone, a video camera, a mobile computer, a head mount display, a rear projection and a front projection.

50. A method of fabricating a semiconductor device, comprising the steps of:

forming an amorphous film containing silicon;

forming an insulator film having a first opening on said amorphous film;

preparing a catalytic element for promoting crystallization of said silicon;

maintaining said catalytic element in contact with said amorphous film or introducing said catalytic element into said amorphous film while using said insulator film as a mask;

heat-treating said amorphous film to crystallize portions of said amorphous film that will become active components;

forming a second opening in said insulator film;

preparing a chemical element selected from group 15 of the periodic table;

introducing said chemical element into regions exposed through bottoms of said first and second openings in the crystallized film simultaneously;

heat-treating said amorphous film to getter said catalytic element into regions doped with said chemical element selected from group 15; and heat-treating said amorphous film in an ambient containing a halogen element to getter said catalytic element into said ambient.

51. The method of claim 50, wherein said second opening is, formed ever a region becoming a lower electrode of an auxiliary capacitor.

52. The method of claim 50, wherein said step of introducing said chemical element into said regions forms gettering regions and the lower electrode of each auxiliary capacitor.

53. The method of claim 50, wherein said catalytic element is at least one element selected from the group consisting of Ni, Co, Fe, Pd. Pt, Cu, and Au.

54. The method of claim 50, wherein said step of introducing said catalytic element is carried out by ion implantation.

55. The method of claim 50, wherein said chemical element selected from group 15 of the periodic table is at least one element selected from the group consisting of P, As, Sb, and Bi.

56. The method of claim 50, wherein said step of introducing said chemical element selected from group 15 is carried out by ion implantation or plasma doping.

57. The method of claim 50, wherein said step of introducing said chemical element selected from group 15 is carried out with a dose of $1\times10^{13}$ to $8\times10^{15}$ atoms/cm$^2$.

58. The method of claim 50, wherein said step of heat-treating said amorphous film to getter said catalytic element using said chemical element is carried out at a temperature of 500 to 700° C., and wherein said step of heat-treating said amorphous film in an ambient containing a halogen element to getter said catalytic element is carried out at a temperature of 700 to 1100° C.

59. The method of claim 50, wherein said semiconductor device is an electroluminescent device.

60. The method of claim 50, wherein said semiconductor device is one of a mobile telephone, a video camera, a mobile computer, a head mount display, a rear projection and a front projection.

61. A method of fabricating a semiconductor device having peripheral circuits and a pixel matrix circuit on a common substrate, said method comprising the steps of:

forming an amorphous film containing silicon;

preparing a catalytic element for promoting crystallization of said silicon;

maintaining said catalytic element in contact with all or some regions becoming said peripheral circuits or introducing said catalytic element into said regions;

heat-treating said amorphous film to crystallize the regions of said amorphous film that will become active components of said peripheral circuits;

preparing a chemical element selected from group 15 of the periodic table;

introducing said chemical element into regions adjacent to said regions becoming said active components and simultaneously into regions becoming a lower electrode of each auxiliary capacitor;

heat-treating said amorphous film to getter said catalytic element into regions doped with said chemical element selected from group 15; and heat-treating said amorphous film in an ambient containing a halogen element to getter said catalytic element into said ambient.

62. The method of claim 61, wherein said step of introducing said chemical element into said regions forms gettering regions and the lower electrode of each auxiliary capacitor.

63. The method of claim 61, wherein said catalytic element is at least one element selected from the group consisting of Ni, Co, Fe, Pd, Pt, Cu, and Au.

64. The method of claim 61, wherein said step of introducing said catalytic element is carried out by ion implantation.

65. The method of claim 61, wherein said chemical element selected from group 15 of the periodic table is at least one element selected from the group consisting of P, As, Sb, and Bi.

66. The method of claim 61, wherein said step of introducing said chemical element selected from group 15 is carried out by ion implantation or plasma doping.

67. The method of claim 61, wherein said step of introducing said chemical element selected from group 15 is carried out with a dose of $1\times10^{13}$ to $8\times10^{15}$ atoms/cm$^2$.

68. The method of claim 61, wherein said step of heat-treating said amorphous film to getter said catalytic element using said chemical element is carried out at a temperature of 500 to 700° C., and wherein said step of heat-treating said amorphous film in an ambient containing a halogen element to getter said catalytic element is carried out at a temperature of 700 to 1100° C.

69. The method of claim 61, wherein said semiconductor device is an electroluminescent device.

70. The method of claim 61, wherein said semiconductor device is one of a mobile telephone, a video camera, a mobile computer, a head mount display, a rear projection and a front projection.

* * * * *